(12) United States Patent
Forrest et al.

(10) Patent No.: US 11,329,241 B2
(45) Date of Patent: May 10, 2022

(54) EXCITON-BLOCKING TREATMENTS FOR BUFFER LAYERS IN ORGANIC PHOTOVOLTAICS

(71) Applicant: The Regents of the University of Michigan, Ann Arbor, MI (US)

(72) Inventors: Stephen R. Forrest, Ann Arbor, MI (US); Byeongseop Song, Ann Arbor, MI (US); Jeramy D. Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 528 days.

(21) Appl. No.: 14/912,756

(22) PCT Filed: Aug. 29, 2014

(86) PCT No.: PCT/US2014/053343
§ 371 (c)(1),
(2) Date: Feb. 18, 2016

(87) PCT Pub. No.: WO2015/031717
PCT Pub. Date: Mar. 5, 2015

(65) Prior Publication Data
US 2016/0204367 A1 Jul. 14, 2016

Related U.S. Application Data

(60) Provisional application No. 61/871,458, filed on Aug. 29, 2013.

(51) Int. Cl.
*H01L 51/42* (2006.01)
*H01L 51/44* (2006.01)
*H01L 51/00* (2006.01)

(52) U.S. Cl.
CPC ...... *H01L 51/4273* (2013.01); *H01L 51/0007* (2013.01); *H01L 51/424* (2013.01);
(Continued)

(58) Field of Classification Search
CPC ............... H01L 51/4273; H01L 51/424; H01L 51/4246
See application file for complete search history.

(56) References Cited

U.S. PATENT DOCUMENTS

| 2009/0188558 A1* | 7/2009 | Jen ...... B82Y 10/00 136/256 |
| 2010/0118390 A1* | 5/2010 | Blair ...... B82Y 20/00 359/346 |

(Continued)

FOREIGN PATENT DOCUMENTS

| WO | WO-2012175921 A1 * 12/2012 ...... H01L 51/5088 |
| WO | WO 2013/104514 7/2013 |

OTHER PUBLICATIONS

Hotchkiss et al., "Modification of the Surface Properties of Indium Tin Oxide with Benzylphosphonic Acids: A Joint Experimental and Theoretical Study", Advanced Materials, 21 (2009): pp. 4496-4501.*

(Continued)

*Primary Examiner* — Michele Fan
(74) *Attorney, Agent, or Firm* — Finnegan, Henderson, Farabow, Garrett & Dunner, LLP

(57) ABSTRACT

Disclosed herein are exciton-blocking treatments for buffer layers used in organic photosensitive optoelectronic devices. More specifically, the organic photosensitive optoelectronic devices described herein include at least one self-assembled monolayer disposed on the surface of an anode buffer layer. Methods of preparing these devices are also disclosed. The present disclosure further relates to methods of forming at least one self-assembled monolayer on a substrate.

31 Claims, 18 Drawing Sheets

(52) U.S. Cl.
CPC ........ *H01L 51/4246* (2013.01); *H01L 51/448* (2013.01); *H01L 2251/303* (2013.01); *Y02E 10/549* (2013.01)

(56) References Cited

U.S. PATENT DOCUMENTS

2012/0111408 A1* 5/2012 Deeken ........... H01L 31/022425
  136/260
2012/0319097 A1* 12/2012 Miskiewicz ........ H01L 51/0071
  257/40
2013/0284242 A1* 10/2013 Jiang ................... H01L 51/0003
  136/251

OTHER PUBLICATIONS

Yang et al., "Organic solar cells employing electrodeposited nickel oxide nanostructures as the anode buffer layer," Solar Energy Materials & Solar Cells, vol. 101, Feb. 29, 2012, pp. 256-261.
International Search Report, PCT/US2015/053343, dated Nov. 10, 2014.

* cited by examiner

EXCITON-BLOCKING TREATMENTS FOR BUFFER LAYERS IN ORGANIC PHOTOVOLTAICS

CROSS-REFERENCE TO RELATED APPLICATIONS

This application claims the benefit of priority to U.S. Provisional Application No. 61/871,458, filed Aug. 29, 2013, which is incorporated herein by reference in its entirety.

STATEMENT REGARDING FEDERALLY SPONSORED RESEARCH

This invention was made with U.S. Government support under Contract Nos. DE-EE0005310 and DE-SC0000957 awarded by the Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and Nanoflex Power Corporation. The agreement was in effect on and before the date the subject matter of the present disclosure was prepared, and was made as result of activities undertaken within the scope of the agreement.

The present disclosure generally relates to electrically active, optically active, solar, and semiconductor devices and, in particular, to organic photosensitive optoelectronic devices comprising at least one self-assembled monolayer disposed on the surface of an anode buffer layer. Also disclosed herein are methods of preparing the organic photosensitive optoelectronic devices. The present disclosure also relates to methods of forming at least one self-assembled monolayer on a substrate.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications; however, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as: FF=$\{I_{max}V_{max}\}/\{I_{SC} \ V_{OC}\}$(1), where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by: $\eta_P$=FF*$(I_{SC}*V_{OC})/P_{inc}$.

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction plays an important role.

The energy level offset at the organic donor-acceptor (D-A) heterojunction is important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency r associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_O$) of an exciton is typically much less ($L_O$~50 Å) than the optical absorption length (~500 Å), requiring a tradeoff between using a thick, and therefore resistive, cell with multiple or highly folded interfaces, or a thin cell with a low optical absorption efficiency.

Organic PV cells have many potential advantages when compared to traditional silicon-based devices. Organic PV cells are light weight, economical in materials use, and can be deposited on low cost substrates, such as flexible plastic foils. For commercialization, however, device efficiencies must further improve via new material and device design approaches.

In organic PV cells, interfacial phenomena can be seen to dominate the behavior of key processes, such as charge separation at the donor/acceptor interface and charge extraction at the organic/electrode interface. To enhance charge extraction while inhibiting exciton quenching and recombination, buffer layers are often used between the photoactive region and one or both of the electrodes.

The ideal organic photovoltaic cell has electron donor and acceptor materials sandwiched between two low-resistance, carrier-selective, and exciton-blocking contact buffer layers. One of the most common anode-side buffer layer treatments is the application of spin-coated PEDOT-PSS. PEDOT-PSS, however, is hygroscopic and corrosive to the commonly used indium tin oxide (ITO) anode substrate, which negatively impacts device stability and lifetime. Furthermore, studies have shown the carrier selectivity of PEDOT-PSS to be poor.

Select organic semiconductors whose highest occupied molecular orbital (HOMO) energies are similar to that of the donor material, along with suitably wide energy gaps have been shown to effectively block excitons generated in vacuum-deposited donor layers without impeding hole transport. Unfortunately, few such exciton blocking materials are also resistant to morphological changes or dissolution when used in solution-processed devices.

Metal oxides have been used as anode-side contact buffer layers. For example, two frequently employed hole-extracting contact materials are $MoO_3$ and NiO. $MoO_3$ has been widely adopted as an anode buffer layer for OPVs in the last several years because it frequently improves open circuit voltage ($V_{oc}$) and charge extraction properties (i.e. fill factor, FF) over untreated ITO and it generally works for a wide variety of materials with various HOMO energies. It has been shown, however, that $MoO_3$ quenches excitons on common donor materials with similar efficiency to $C_{60}$. It is believed this quenching is due to the very deep frontier orbital energy levels that form a staggered-gap heterojunction with the donor material, similar to a donor-acceptor interface. NiO has favorable energy levels that straddle most donor materials. Nonetheless, NiO also efficiently quenches excitons. Presumably, this quenching is due to electrically active surface states that are common on inorganic solids. For a bilayer architecture, the consequence of an exciton-quenching buffer is that only about half of the photons absorbed in the donor can be collected as photocurrent. The losses in bulk heterojunction cells are less, but still exist.

The devices and methods of the present disclosure reduce exciton quenching at the anode buffer layer without sacrificing hole extraction efficiency, resulting in improved device performance. In particular, the devices and methods of the present disclosure use at least one self-assembled monolayer disposed on the anode buffer layer to reduce exciton quenching and improve device performance.

The present disclosure includes an organic photosensitive optoelectronic device comprising an anode and a cathode in superposed relation, a photoactive region comprising at least one organic donor material and at least one organic acceptor material disposed between the anode and the cathode forming a donor-acceptor heterojunction, an anode buffer layer disposed between the anode and the photoactive region, wherein the anode buffer layer has a bottom surface closer to the anode and a top surface further from the anode, and at least one self-assembled monolayer (SAM) disposed on the top surface of the anode buffer layer.

Also disclosed is a method of forming an organic photosensitive optoelectronic device comprising depositing an anode buffer layer over an anode, wherein the anode buffer layer has a bottom surface closer to the anode and a top surface further from the anode, depositing at least one SAM on the top surface of the anode buffer layer, depositing a photoactive region over the anode buffer layer, wherein the photoactive region comprises at least one organic donor material and at least one organic acceptor material forming a donor-acceptor heterojunction, and depositing a cathode over the photoactive region.

Further disclosed is a method of forming at least one self-assembled monolayer on a transition metal oxide substrate, comprising providing a substrate comprising a transition metal oxide, and applying a solution to at least one surface of the substrate, wherein the solution comprises a tetrahydrofuran (THF) solvent and molecules chosen from phosphonic acids, carboxylic acids, silanes, and thiols.

There is also disclosed a method of forming at least one self-assembled monolayer on a NiO substrate, comprising providing a substrate comprising NiO or an alloy thereof, and spin coating a solution onto at least one surface of the substrate, wherein the solution comprises a solvent and molecules chosen from phosphonic acids, carboxylic acids, silanes, and thiols.

The accompanying figures are incorporated in, and constitute a part of this specification.

FIG. 1 shows a schematic of an exemplary organic photosensitive optoelectronic device in accordance with the present disclosure.

FIG. 2A shows HOMO and LUMO (transport) energy levels of materials based on literature values. HOMO energies were confirmed by UPS for NiO, SubPc, and DPSQ. All energy values are in eV relative to the absolute vacuum level, except for $MoO_3$ which is shifted to lower energy by ~1 eV to allow for Fermi energy ($E_F$) alignment with the donor material. FIG. 2B shows HOMO ionization energy (IE), work function (WF), and vacuum level offsets ($\Delta E_{VAC}$) in eV for NiO and BPA treated NiO, as well as for SubPc and DPSQ deposited on each buffer. FIG. 2C shows PL intensity versus wavelength of a 32 nm-thick SubPc layer fabricated on untreated and BPA treated $MoO_3$ and NiO. A photoluminescence (PL) response similar to the BPhen reference indicates a fully blocking interface while a response similar to the $C_{60}$ buffer indicates a perfectly exciton quenching interface. Inset: Molecular structural formula of BPA.

FIG. 3 shows PL of quartz/test layer (8 nm)/SubPc (40 nm)/BPhen (8 nm). The test layers were $C_{60}$ (~8 nm), BPhen (8 nm), $MoO_3$ (16 nm), and benzylphosphonic acid (BPA) treated $MoO_3$ where the BPA treatment resulted in the addition of one or more self assembled monolayers on the $MoO_3$ having the following thicknesses: a spin coated 1 g BPA/l solution (~5.4 nm thick), a spin coated 0.5 g BPA/l solution (~2.2 nm thick), spin coated 0.25 g BPA/l solution (~0.6 nm thick), and a BPA soak (~0.5 nm thick). The emitted light was measured at a wavelength of λ=710 nm (top graph), and the excitation wavelength at λ=525 nm (bottom graph).

FIG. 4 shows PL of quartz/test layer (8 nm)/SubPc (40 nm)/BPhen (8 nm). The test layers were $C_{60}$ (~8 nm), BPhen (8 nm), $MoO_3$ (16 nm), BPA-treated $MoO_3$, octylphosphonic acid (OPA)-treated $MoO_3$ where the treatments resulted in the addition of one or more self assembled monolayers on the $MoO_3$ having the following thicknesses: spin coated 0.5 g BPA/l solution (~2.2 nm thick), spin coated 0.5 g OPA/l solution (~3.5 nm thick). The emitted light was measured at a wavelength of λ=710 nm (top graph), and the excitation wavelength at λ=525 nm (bottom graph).

FIG. 5 shows PL of quartz/test layer (8 nm)/SubPc (47 nm)/BPhen (8 nm). The test layers were $C_{60}$ (~8 nm), BCP (8 nm), NiO (8 nm), BPA-treated NiO, OPA-treated NiO, methylphosphonic acid (MePA)-treated NiO, and phosphorous acid (Phosphorous)-treated NiO where the treatments resulted in the addition of one or more self-assembled monolayers on the NiO having the following thicknesses: spin coated 1 g BPA/l solution (~0.5 nm thick), spin coated 1 g OPA/l solution (~0.5 nm thick), spin coated MePA and Phosphorous (too thin to measure with VASE). An NiO sample soaked in BPA was also generated. The emitted light was measured at a wavelength of λ=710 nm (top graph), and the excitation wavelength at λ=525 nm (bottom graph).

Figure 10:
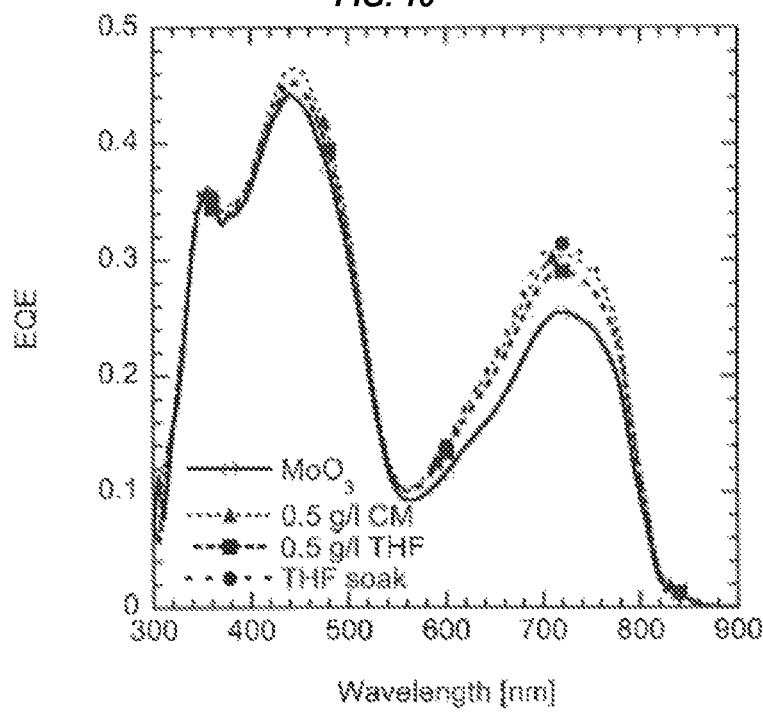
Figure 10:
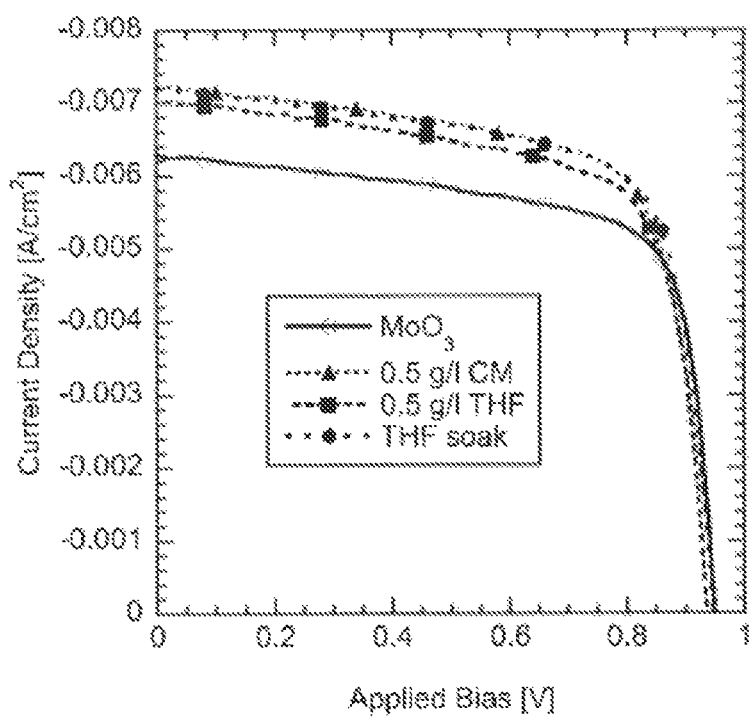

FIG. 10 shows EQE (top) and current-voltage performance (bottom) for devices with the structure: glass/ITO/ buffer/DPSQ (9 nm)/$C_{60}$ (40 nm)/PTCBI (5 nm)/Ag (100 nm). $MoO_3$ represents the reference untreated device. "0.5 g/l CM" and "0.5 g/l THF" indicate that BPA was spin coated onto $MoO_3$ from a chloroform methanol solution or THF, respectively, and "THF soak" indicates that the $MoO_3$ anode buffer was soaked for 30 minutes in BPA dissolved in THF.

Figure 11:
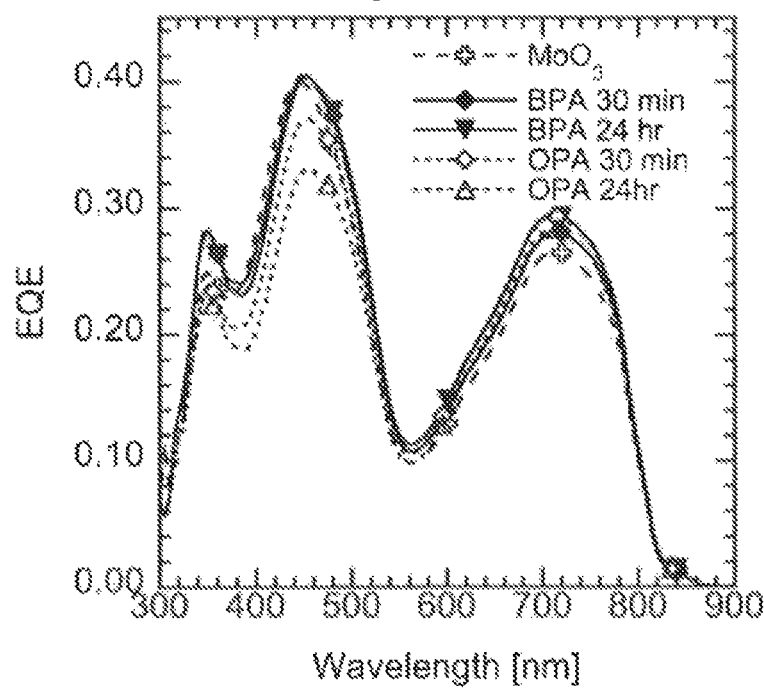
Figure 11:
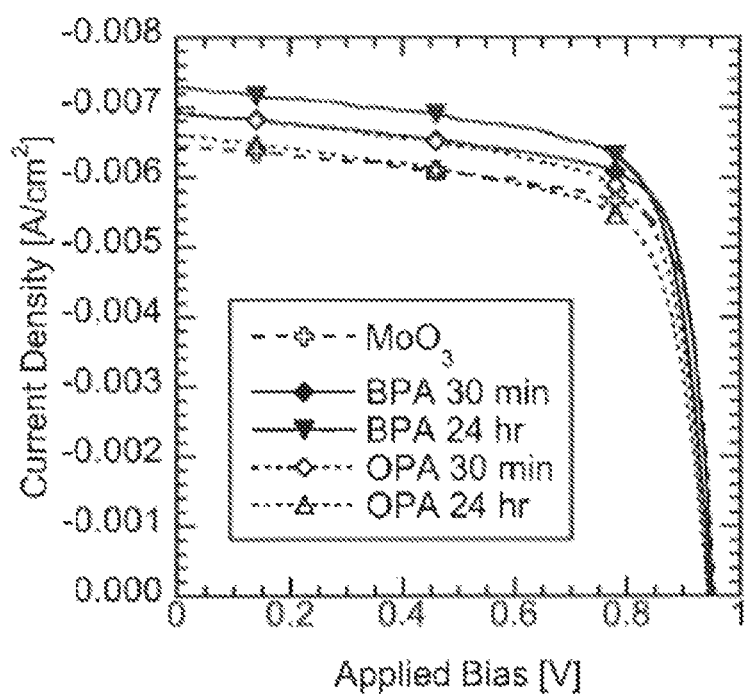

FIG. 11 shows EQE (top) and current-voltage performance (bottom) for devices with the structure: glass/ITO/ buffer/DPSQ (9 nm)/$C_{60}$ (40 nm)/PTCBI (5 nm)/Ag (100 nm), where the $MoO_3$ buffer was soaked in phosphonic acid solutions for various soak times.

Figure 12:
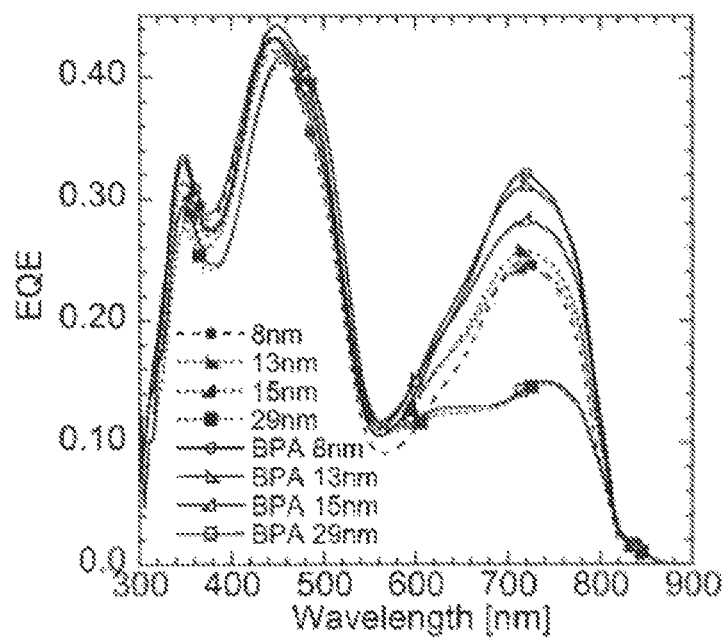
Figure 12:
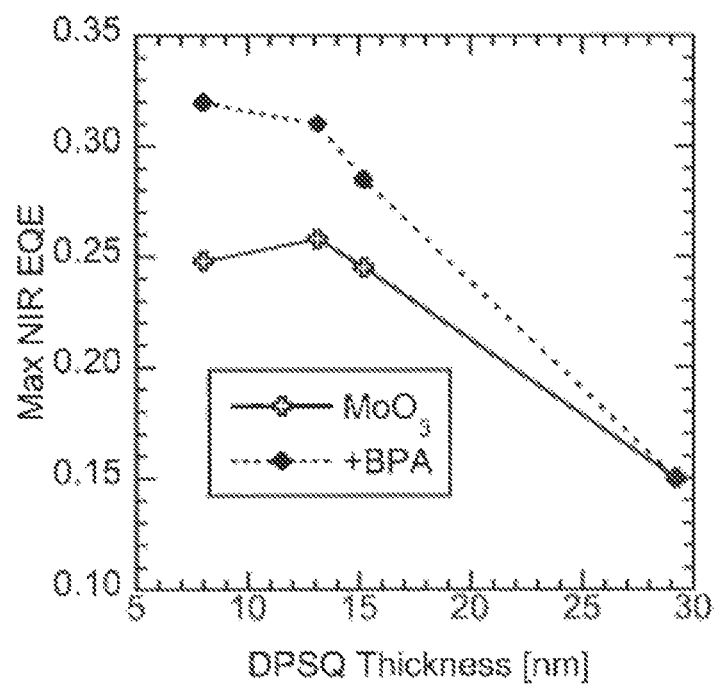

FIG. 12 shows EQE (top) and NIR EQE as a function of DPSQ thickness for devices with the structure: ITO/$MoO_3$ (20 nm)/DPSQ (x nm)/$C_{60}$ (40 nm)/PTCBI (5 nm)/Ag (100 nm), where $MoO_3$ indicates the reference untreated device and "+BPA" indicates that the $MoO_3$ buffer was soaked in a 1 mM solution of BPA in THF for ~24 hours.

Figure 13:
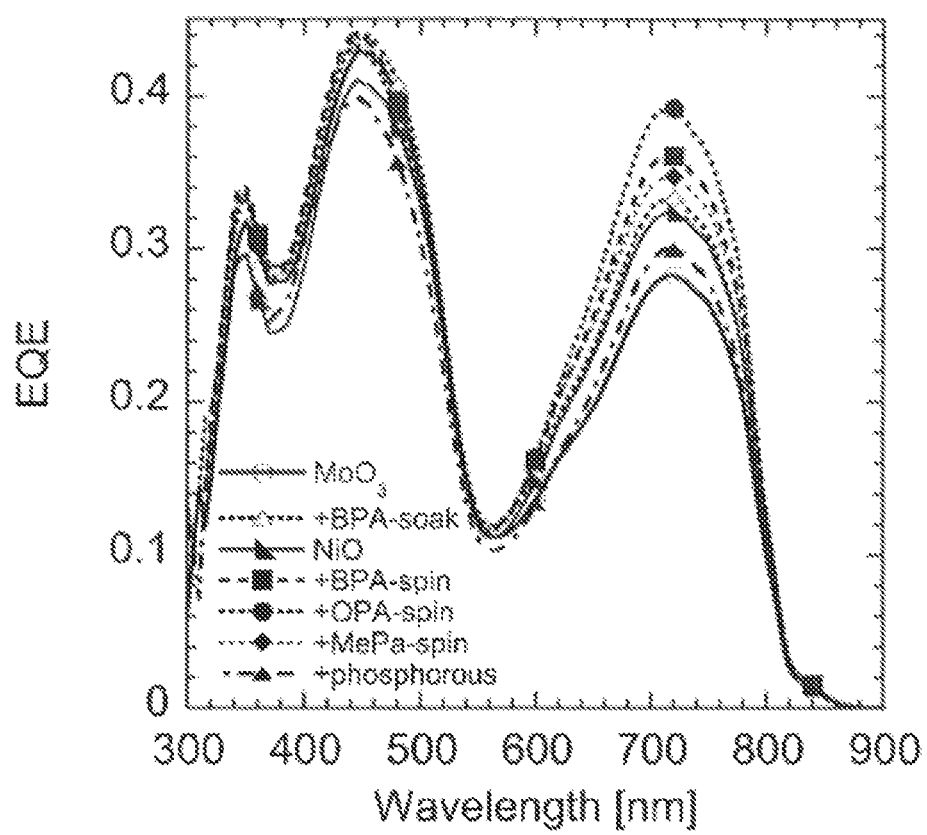

FIG. 13 shows EQE for devices with the structure: glass/ITO/buffer/DPSQ (9 nm)/$C_{60}$ (40 nm)/PTCBI (5 nm)/ Ag (100 nm). Various untreated and phosphonic acid treated buffers were used.

Figure 14:
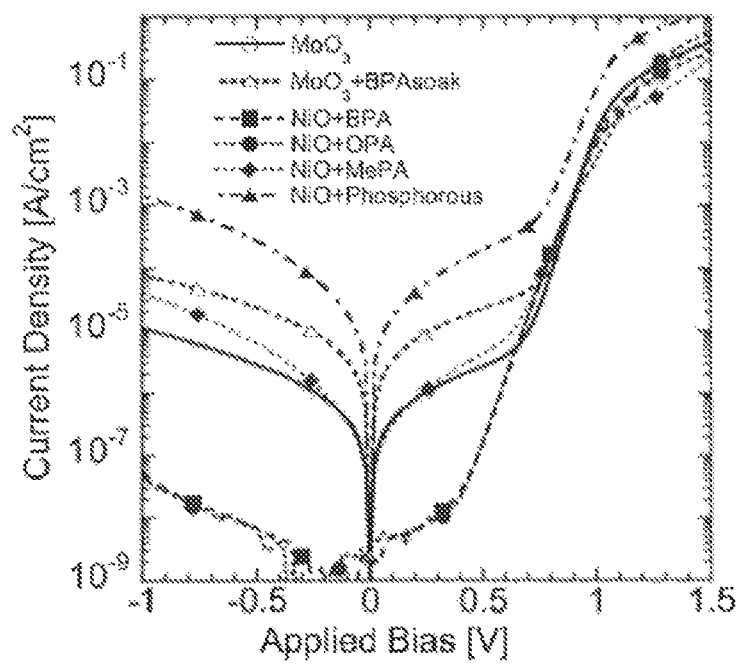
Figure 14:
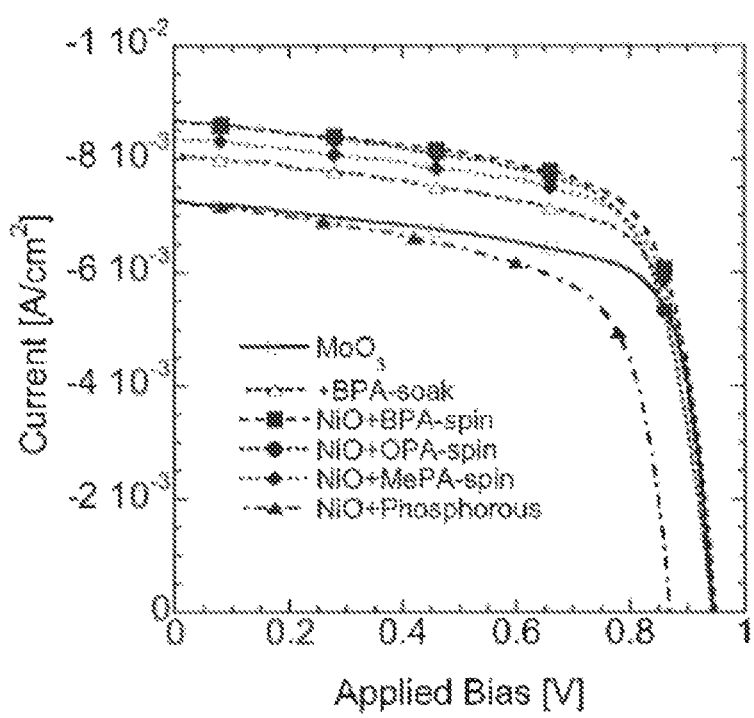

FIG. 14 shows EQE (top) and current-voltage performance (bottom) for the devices with the $MoO_3$ reference buffer, the BPA-soaked $MoO_3$ buffer, the BPA spin coated NiO buffer, the OPA spin coated NiO buffer, the MePA spin coated NiO buffer, and the phosphorous acid spin coated NiO buffer.

Figure 15:
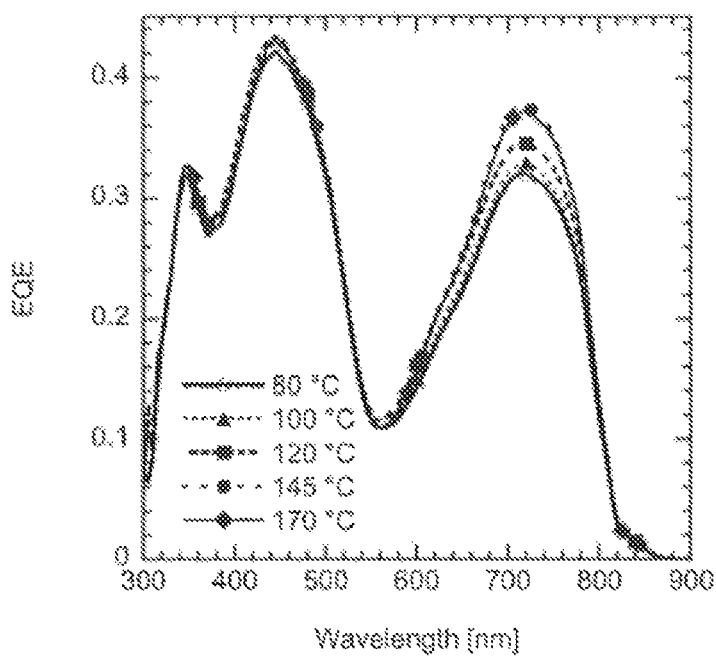

FIG. 15 shows EQE (top) and current-voltage performance (bottom) for devices with the structure: glass/ITO/ buffer/DPSQ (9 nm)/$C_{60}$ (40 nm)/PTCBI (5 nm)/Ag (100 nm), where BPA was bonded to the NiO buffer at various heating temperatures.

Figure 16:
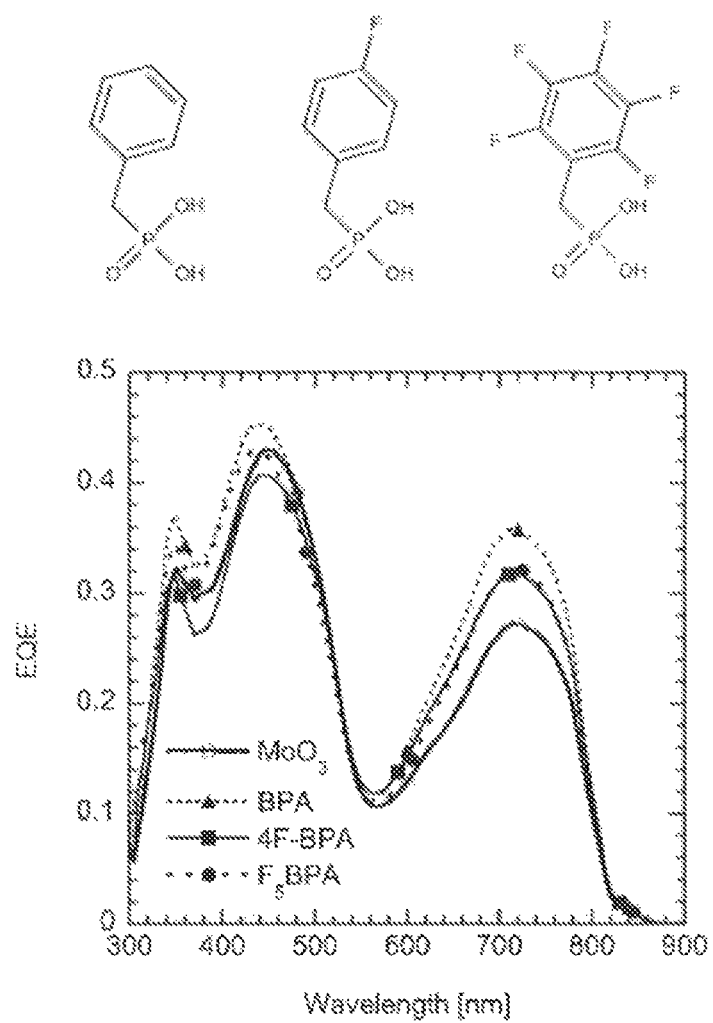

FIG. 16 shows chemical structures for BPA (left), 4-fluoro BPA (4F-BPA, center), and pentafluoro BPA ($F_5$BPA, right). EQE is shown for devices with the structure: glass/ITO/ buffer/DPSQ (9 nm)/$C_{60}$ (40 nm)/PTCBI (5 nm)/Ag (100 nm), where the anode buffers were treated with the various modified BPA compounds.

Figure 17:
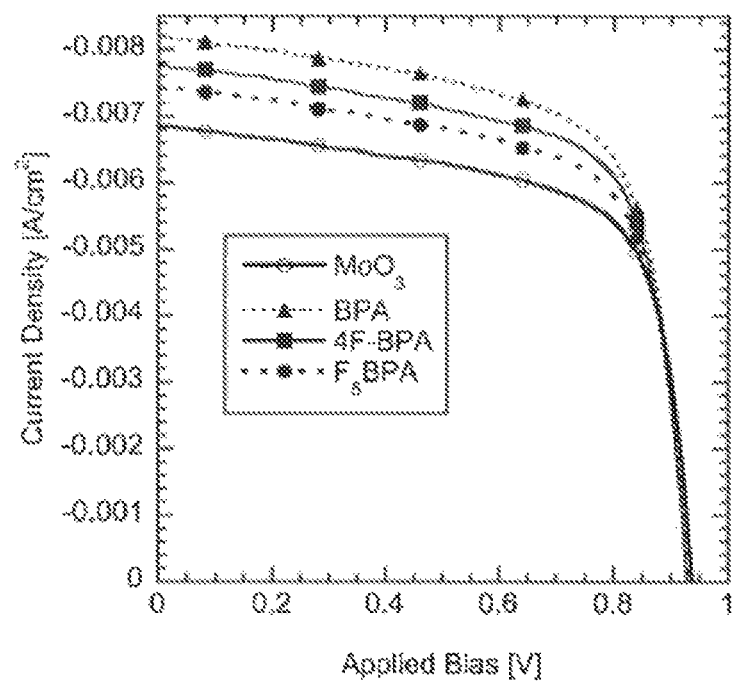
Figure 17:
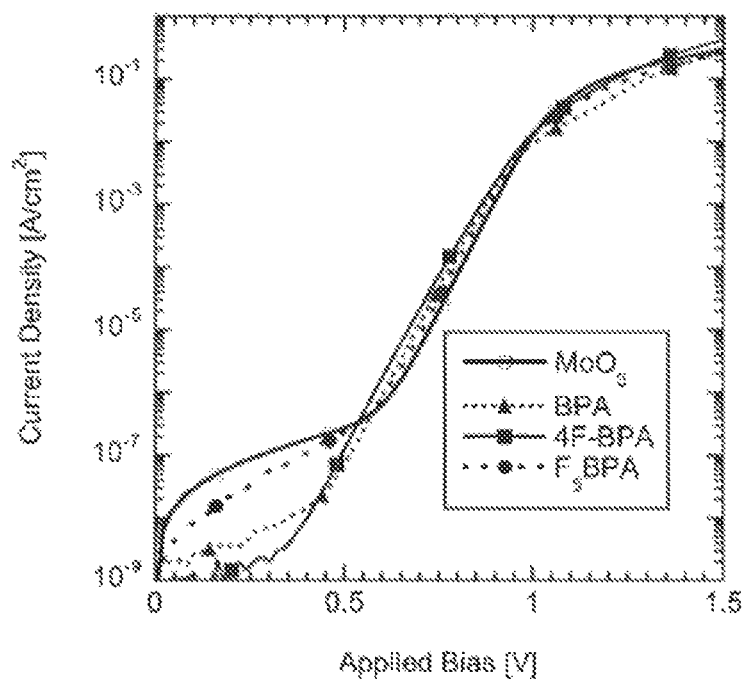

FIG. 17 shows the photoresponse (top) and forward bias dark current (bottom) for the devices in FIG. 16.

Figure 18:
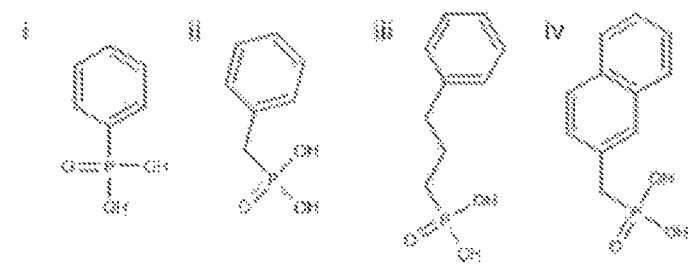
Figure 18:
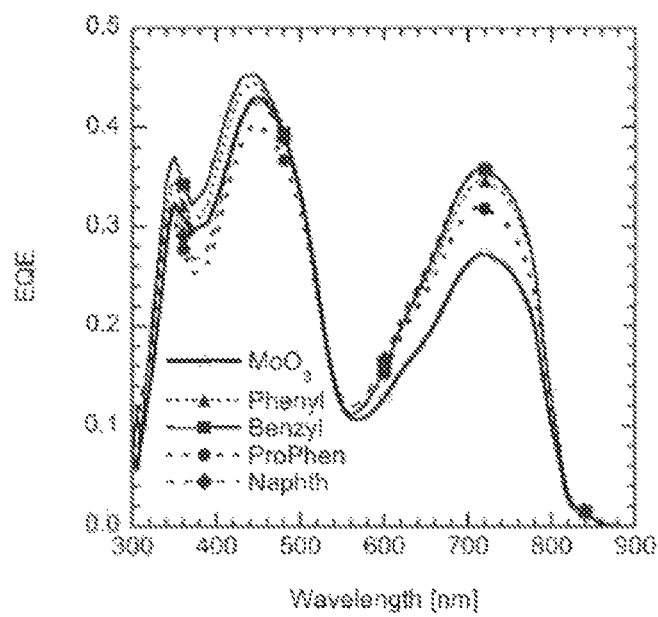
Figure 18:
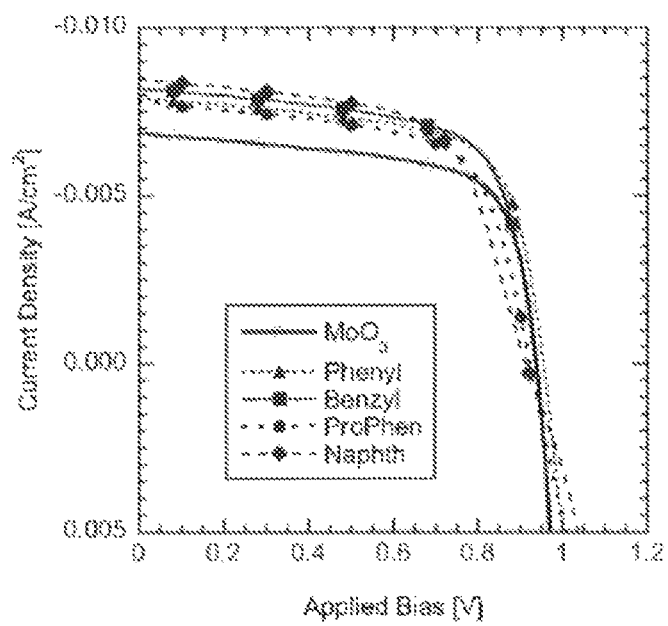

FIG. 18 shows chemical structures for (i) phenylphosphonic acid (Phenyl), (ii) BPA (Benzyl), (iii) propylphenylphosphonic acid (ProPhen), and (iv) 2-naphthylmethylphosphonic acid (Naphth). EQE (top) and current-voltage performance (bottom) are shown for devices with the various arylphosphonic acid treatments applied to an NiO buffer.

Figure 19:
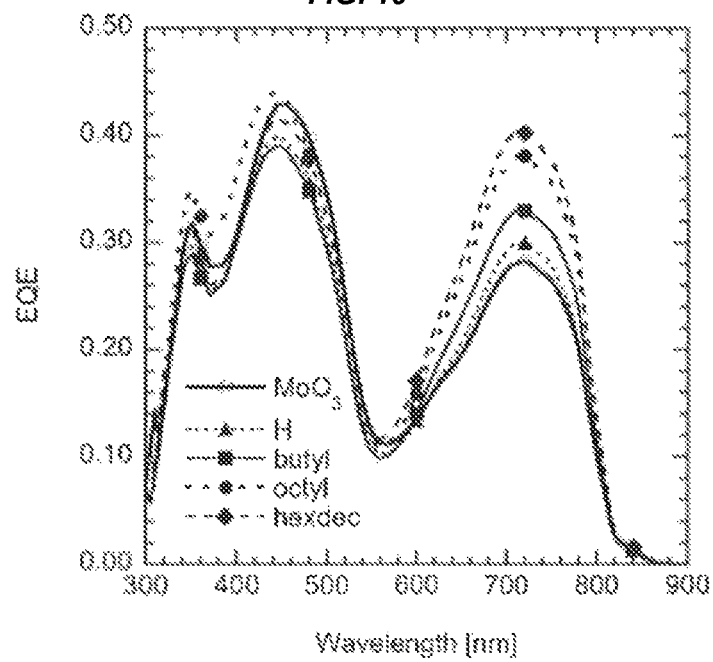
Figure 19:
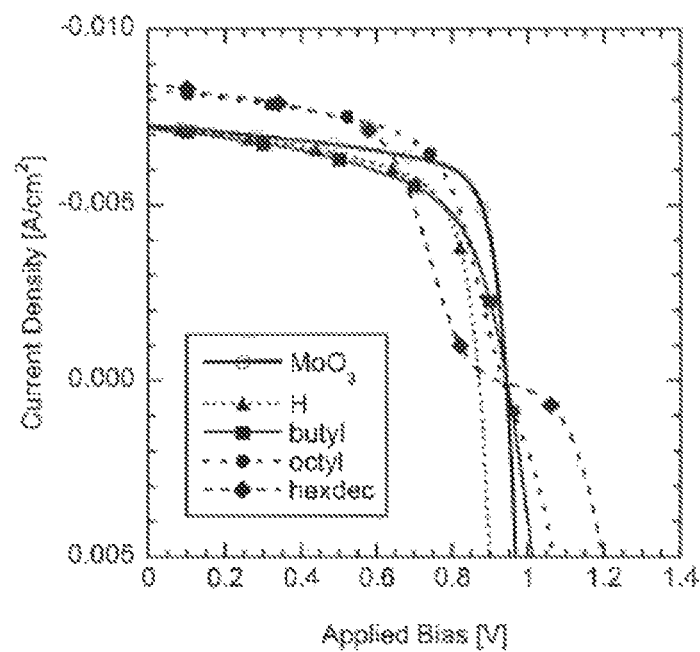

FIG. 19 shows EQE (top) and current-voltage performance for devices with phosphorous acid treatment (H) and various alkylphosphonic acid treatments applied to an NiO buffer, including n-butylphosphonic acid (butyl), n-octylphosphonic acid (octyl), and n-hexadecylphosphonic acid treatments.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

In the context of the organic materials of the present disclosure, the terms "donor" and "acceptor" refer to the relative positions of the Highest Occupied Molecular Orbital (HOMO) and Lowest Unoccupied Molecular Orbital (LUMO) energy levels of two contacting but different organic materials. If the LUMO energy level of one material in contact with another is further from the vacuum level, then that material is an acceptor. Otherwise it is a donor. It is energetically favorable, in the absence of an external bias, for electrons at a donor-acceptor junction to move into the acceptor material, and for holes to move into the donor material.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material.

Similarly, the term "anode" is used herein such that in a solar cell under illumination, holes move to the anode from the adjacent photoconducting material, which is equivalent to electrons moving in the opposite manner. It is noted that the "anode" and "cathode" electrodes may be charge transfer regions or recombination zones, such as those used in tandem photovoltaic devices. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less that 50% transmission of ambient electromagnetic radiation in relevant wavelengths. The opposing electrode may be a reflective material so that light which has passed through the cell without being absorbed is reflected back through the cell.

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

In one aspect of the present disclosure, an organic photosensitive optoelectronic device comprises an anode and a cathode in superposed relation, a photoactive region comprising at least one organic donor material and at least one organic acceptor material disposed between the anode and the cathode forming a donor-acceptor heterojunction, an anode buffer layer disposed between the anode and the photoactive region, wherein the anode buffer layer has a bottom surface closer to the anode and a top surface further from the anode, and at least one SAM disposed on the top surface of the anode buffer layer.

Figure 1:
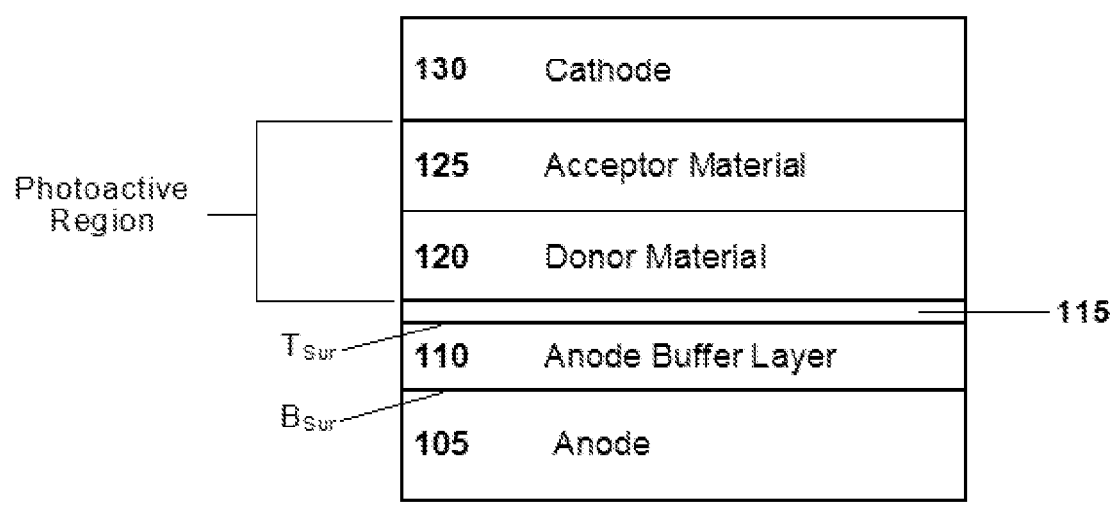

A non-limiting example of an organic photosensitive device according to the present disclosure is shown in FIG. 1. The device comprises anode 105 and cathode 130 in superposed relation. Anode buffer layer 110 is disposed between anode 105 and the photoactive region, which comprises at least one organic donor material 120 and at least one organic acceptor material 125 forming a donor-acceptor heterojunction. As used herein, the term donor-acceptor heterojunction refers to the interface between a donor material and an acceptor material for dissociating excitons into holes and electrons. FIG. 1 shows a bilayer photoactive region where the at least one organic donor material 120 and the at least one organic acceptor material 125 form a planar heterojunction. It should be understood that the devices of the present disclosure are not limited to planar heterojunctions. The donor and acceptor materials may be arranged in any manner known in the art for organic photosensitive optoelectronic devices. For example, the donor and acceptor materials may form a planar heterojunction, mixed heterojunction, bulk heterojunction, or planar-mixed heterojunction.

Anode buffer layer 110 has a bottom surface $B_{Sur}$ closer to anode 105 and a top surface $T_{Sur}$ further from anode 105. At least one SAM 115 is disposed on the top surface $T_{Sur}$ of anode buffer layer 110.

As used herein, the term "self-assembled monolayer" refers to a layer of molecules assembled on a substrate surface, wherein the molecules include "head groups" that attach the molecules (e.g., by chemical bonds) to the surface, and "tail groups" comprising one or more of a wide variety of carbon containing "organic" groups such as alkyl chains, aryl groups, such as benzene, and/or modified groups, such as fluorinated benzene. The head groups may comprise functional groups having an affinity to the substrate surface capable of anchoring the molecules to the surface. Suitable "head groups" include, but are not limited to, phosphonic acid, carboxylic acid, silanes (such as trichlorosilanes or trimethoxysilanes), and thiols.

A "self-assembled monolayer" as used herein may, but need not, cover the entire top surface $T_{Sur}$ of the anode buffer layer (i.e., the self-assembled monolayer need not be a continuous layer across the entire substrate surface). For example, the at least one self-assembled monolayer may cover at least 50% of the surface, such as covering at least 75%, at least 85%, at least 95%, or even 100% of the surface.

As used herein, the language "at least one self-assembled monolayer" allows for one or more self-assembled monolayers to be disposed on the top surface $T_{Sur}$ of the anode buffer layer. For example, a second SAM may be stacked on top of a first SAM. In some embodiments, two or more self-assembled monolayers are disposed on the top surface $T_{Sur}$ of the anode buffer layer, such as two SAMs, three SAMs, four SAMs, or five SAMs.

In some embodiments, the at least one SAM 115 comprises molecules chosen from phosphonic acids, carboxylic acids, silanes, and thiols. Phosphonic acids, carboxylic acids, silanes, thiols, and other molecules for forming SAMs have been described in the art and may be used to form SAMs in accordance with the present disclosure. Disclosure of more specific molecules for forming SAMs is set forth below.

Phosphonic acids have the general formula

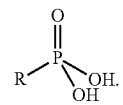

In some embodiments, the phosphonic acids are chosen from alkylphosphonic acids or functionalized derivatives thereof and arylphosphonic acids. As used herein, the term "alkylphosphonic acids" refers to phosphonic acids where the R group comprises a straight-chain or branched saturated hydrocarbyl group. As used herein, the term "arylphosphonic acids" refers to phosphonic acids where the R group comprises at least one aromatic ring. For example, the term "arylphosphonic acids" includes phosphonic acids containing carbon chains of various lengths terminated with at least one aromatic ring.

In some embodiments, the arylphosphonic acids are chosen from phenylphosphonic acid, benzylphosphonic acid (BPA), propylphenyl phosphonic acid, napthylmethylphosphonic acid, and functionalized derivatives thereof.

In some embodiments, the alkylphosphonic acids are chosen from

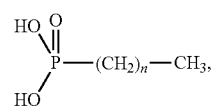

wherein n is chosen from 0 to 15. In certain embodiments, the alkylphosphonic acids are chosen from methylphosphonic acid, ethylphosphonic acid, propylphosphonic acid, butylphosphonic acid, and functionalized derivatives thereof. In some embodiments, the phosphonic acids are chosen from BPA or a functionalized derivative thereof and butylphosphonic acid or a functionalized derivative thereof.

Carboxylic acids have the general formula

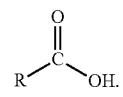

In some embodiments, the carboxylic acids are chosen from alkylcarboxylic acids or functionalized derivatives thereof and arylcarboxylic acids. As used herein, the term "alkylcarboxylic acids" refers to carboxylic acids where the R group comprises a straight-chain or branched saturated hydrocarbyl group. As used herein, the term "arylcarboxylic acids" refers to carboxylic acids where the R group comprises at least one aromatic ring. For example, the term "arylcarboxylic acids" includes carboxylic acids containing carbon chains of various lengths terminated with at least one aromatic ring. In some embodiments, the carboxylic acids are chosen from benzoic acid, phenylacetic acid, and derivatives thereof.

Thiols have the general formula R—SH. Sulfur is affinitive to various metals (e.g. gold, silver and copper). In some embodiments, the thiols are chosen from alkylthiols or functionalized derivatives thereof and arylthiols. As used herein, the term "alkylthiols" refers to thiols where the R group comprises a straight-chain or branched saturated hydrocarbyl group. As used herein, the term "arylthiols" refers to thiols where the R group comprises at least one aromatic ring. For example, the term "arylthiols" includes thiols containing carbon chains of various lengths terminated with at least one aromatic ring. In some embodiments, the thiols are chosen from thiophenol, benzythiol, and derivatives thereof.

Examples of suitable silanes include trichlorosilanes, such as alkyltrichlorosilanes and aryltrichlorosilanes, and trimethoxysilanes, such as alkyltrimethoxysilanes and aryltrimethoxysilanes.

In accordance with the present disclosure, when the at least one self-assembled monolayer is said to comprise molecules chosen from phosphonic acids, carboxylic acids, silanes, thiols, etc., this includes where the phosphonic acid, carboxylic acid, silane, thiol, etc. Is bonded to the anode buffer layer. For example, the at least one self-assembled monolayer may comprise a phosphonic acid when the self-assembled monolayer includes a phosphonic acid that is bonded to the anode buffer layer via, for example, one, two, or all three oxygens in the general formula to metal sites on the anode buffer layer surface.

The thickness of the at least one self-assembled monolayer can depend on the type of molecules that form the SAM. For example, one SAM of methylphosphonic acid may result in a thickness of about 0.3 nm, whereas one SAM of benzylphosphonic acid and one SAM of hexadecylphosphonic acid may result in thicknesses of about 0.5-0.6 nm and about 2 nm, respectively. Thus, thickness may be optimized for peak device performance, for example, based on the molecules chosen to form the at least one SAM. Thickness optimization may be performed by balancing the beneficial reduction of exciton quenching with the potential for increased series resistance. In some embodiments, the at least one SAM has a thickness in a range from about 0.1 nm to about 5 nm, such as from about 0.1 nm to about 3 nm, from about 0.2 nm to about 2 nm, from about 0.3 nm to about 1.5 nm, from about 0.4 nm to about 1 nm, or from about 0.5 nm to about 0.8 nm.

In some embodiments, the anode buffer layer comprises a transition metal oxide. Suitable transition metal oxides include, but are not limited to, $MoO_3$, $V_2O_3$, $ReO_3$, $WO_3$, $TiO_2$, $Ta_2O_3$, ZnO, NiO, and alloys thereof. In certain embodiments, the transition metal oxide is chosen from $MoO_3$, NiO, and alloys thereof. In certain embodiments, the anode buffer layer comprises a transition metal oxide, and the at least one SAM comprises at least one phosphonic acid, such as BPA or a functionalized derivative thereof.

In some embodiments of the present disclosure, the anode buffer layer in the device exhibits less exciton quenching behavior compared to the anode buffer layer in the device without the one or more self-assembled monolayers. In some embodiments, the device exhibits a greater power conversion efficiency compared to the device without the one or more self-assembled monolayers.

The devices of the present disclosure may include additional buffer layers. For example, although not shown in FIG. 1, the device may include a cathode buffer layer disposed between the photoactive region and the cathode. The cathode buffer layer should be chosen to block excitons and to facilitate electron transport to the cathode. In some embodiments, the cathode buffer layer comprises a material chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (Ru(acac)3), and aluminum(III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). In some embodiments, the cathode buffer layer further comprises an electron-transporting material. In certain embodiments, the electron-transporting material comprises the same material as the at least one acceptor material. In certain embodiments, the electron-transporting material is a fullerene, such as Coo.

The present disclosure is not limited to any particular combination of organic donor and acceptor materials. In some embodiments, the at least one organic acceptor material comprises a material chosen from subphthalocyanines, subnaphthalocyanines, dipyrrin complexes, such as zinc dipyrrin complexes, BODIPY complexes, perylenes, naphthalenes, fullerenes and fullerene derivatives (e.g., PCBMs, ICBA, ICMA, etc.), and polymers, such as carbonyl substituted polythiophenes, cyano-substituted polythiophenes, polyphenylenevinylenes, or polymers containing electron deficient monomers, such as perylene diimide, benzothiadiazole or fullerene polymers. Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60] PCBM), Phenyl-$C_{71}$-Butyric-Acid-Methyl Ester ([70] PCBM), or Thienyl-$C_{61}$-Butyric-Acid-Methyl Ester ([60] ThCBM), and other acceptors such as 3,4,9,10-perylenetetracarboxylic-bisbenzimidazole (PTCBI), hexadecafluorophthalocyanine ($F_{16}$CuPc), and derivatives thereof.

In some embodiments, the at least one organic donor material comprises a material chosen from phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, borondipyrromethene (BODIPY) dyes, thiophenes, such as poly (3-hexylthiophene) (P3HT), low band-gap polymers, polyacenes, such as pentacene and tetracene, diindenoperylene (DIP), squaraines (SQ), tetraphenyldibenzoperiflanthene (DBP), and derivatives thereof. Examples of squaraine donor materials include, but are not limited to, 2,4-bis[4-(N,N-dipropylamino)-2,6-dihydroxyphenyl]squaraine, 2,4-bis[4-(N,Ndiisobutylamino)-2,6-dihydroxyphenyl]squaraine, 2,4-bis[4-(N,N-diphenylamino)-2,6-dihydroxyphenyl] squaraine (DPSQ).

In certain embodiments, the at least one organic donor material is chosen from squaraines or functionalized derivatives thereof, and the at least one acceptor material is chosen from fullerenes or functionalized derivatives thereof. In certain embodiments, the squaraine is DPSQ and the fullerene is $C_{60}$.

The organic photosensitive optoelectronic devices disclosed herein can be grown or placed on any substrate that provides desired structural properties. Thus, in some embodiments, the device further comprises a substrate. For example, the substrate may be flexible or rigid, planar or non-planar. The substrate may be transparent, translucent or opaque. The substrate may be reflective. Plastic, glass, metal, and quartz are examples of rigid substrate materials. Plastic and metal foils and thin glass are examples of flexible substrate materials. The material and thickness of the substrate may be chosen to obtain the desired structural and optical properties.

The organic photosensitive optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes (i.e., an anode and a cathode). A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

Materials may be deposited using techniques known in the art. For example, materials described herein may be deposited or co-deposited from a solution, vapor, or a combination of both. Depending on the material and the desired deposition technique, materials may be deposited or co-deposited via solution processing, such as by one or more techniques chosen from spin-coating, spin-casting, spray coating, dip coating, doctor-blading, inkjet printing, or transfer printing. Similarly, materials may be deposited or co-deposited using vacuum evaporation, such as vacuum thermal evaporation, electron beam evaporation, organic vapor phase deposition, or organic vapor-jet printing.

Organic photosensitive optoelectronic devices of the present disclosure may function, for example, as PV devices, such as solar cells, photodetectors, or photoconductors.

Whenever the organic photosensitive optoelectronic devices described herein function as a PV device, the materials used in the photoconductive organic layers and the thicknesses thereof may be selected, for example, to optimize the external quantum efficiency of the device. For example, appropriate thicknesses can be selected to achieve the desired optical spacing in the device and/or reduce resistance in the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

Also disclosed is a method of forming an organic photosensitive optoelectronic device comprising depositing an anode buffer layer over an anode, wherein the anode buffer layer has a bottom surface closer to the anode and a top surface further from the anode, depositing at least one SAM on the top surface of the anode buffer layer, depositing a photoactive region over the anode buffer layer, wherein the photoactive region comprises at least one organic donor material and at least one organic acceptor material forming a donor-acceptor heterojunction, and depositing a cathode over the photoactive region.

In some embodiments, the step of depositing the at least one SAM comprises applying a solution or vapor to at least the top surface of the anode buffer layer. For example, in some embodiments, the at least one SAM is deposited on the top surface of the anode buffer layer by physical vapor deposition. If applying a solution, the solution comprises a solvent and the material for forming the at least one SAM. In some embodiments, the solution comprises a solvent and molecules chosen from phosphonic acids, carboxylic acids, silanes and thiols. Concentration in the solvent should be sufficient to coat the top surface of the anode buffer layer for forming the at least one SAM. For example, in some embodiments, the concentration of a phosphonic acid in the solution ranges from 0.25 mg/ml to 1 mg/ml.

In some embodiments, the solvent comprises an alcohol, such as methanol or ethanol, or tetrahydrofuran (THF). In certain embodiments, the solvent comprises a mixture of an alcohol with a less polar solvent, such as a mixture of ethanol and chloroform.

In some embodiments, the solution comprises at least one phosphonic acid. In some embodiments, the solution comprises a THF solvent and at least one phosphonic acid. In some embodiments, the at least one phosphonic acid is a phosphonic acid described herein. In certain embodiments, the at least one phosphonic acid is BPA or a functionalized derivative thereof.

Suitable techniques for applying the solution to at least the top surface of the anode buffer layer include, but are not limited to, spin coating, soaking, spray coating, blade coating, and slot dye coating.

In some embodiments, the anode buffer layer comprises a transition metal oxide. Examples of suitable transition metal oxides are $MoO_3$, $V_2O_3$, $ReO_3$, $WO_3$ $TiO_2$, $Ta_2O_3$, ZnO, NiO, and alloys thereof. In some embodiments, the anode buffer layer comprises a transition metal oxide and the solution is applied by spin coating or soaking. In certain of these embodiments, the transition metal oxide is chosen from $MoO_3$, NiO, and alloys thereof.

The step of depositing the at least one SAM may further comprise heating the anode buffer layer. Heating may occur, for example, during the application of the solution to at least the top surface of the anode buffer layer and/or after applying the solution. Heating can ensure that the at least one SAM bonds to the surface of the anode buffer layer (i.e., the "head groups" as described above may bond to the surface of the anode buffer layer). In some embodiments, the anode buffer layer is heated at a temperature in a range from 40° C. to 200° C., such as from 80° C. to 160° C., from 100° C. to 140° C., from 110° C. to 130° C., or from 115° C. to 125° C.

The step of depositing at least one SAM may further comprise rinsing at least the top surface of the anode buffer layer with a solvent. In some embodiments, the solvent used for rinsing is the same solvent used in the solution, such as THF. In certain embodiments, the solution comprises at least one phosphonic acid and THF, and the solvent used for rinsing is THF.

In some embodiments, the anode buffer layer comprises NiO or an alloy thereof. In some of these embodiments, the solution is applied by spin coating. In certain embodiments, the solution comprises at least one phosphonic acid, such as BPA. In certain embodiments, the phosphonic acid solution comprises THF as the solvent.

In some embodiments, the anode buffer layer comprises a transition metal oxide chosen from $MoO_3$, $V_2O_3$, $ReO_3$, $WO_3$, $Ta_2O_3$ and alloys thereof. In certain of these embodiments, the solution is applied by soaking. In certain embodiments, the solution comprises at least one phosphonic acid, such as BPA. In certain embodiments, the phosphonic acid solution comprises THF as the solvent.

As described above, the thickness of the at least one SAM may be optimized for peak device performance. In some embodiments, the at least one SAM has a thickness in a range from about 0.1 nm to about 5 nm, such as from about 0.1 nm to about 3 nm, from about 0.2 nm to about 2 nm, from about 0.3 nm to about 1.5 nm, from about 0.4 nm to about 1 nm, or from about 0.5 nm to about 0.8 nm. It is noted that when the solution is applied to the top surface of the anode buffer layer for forming the at least one SAM, the resulting thickness disposed on the top surface of the anode buffer layer may be greater than the thickness ranges described above. For example, applying the solution to the anode buffer layer may result in a film approximately 1 nm to 10 nm thick. Upon further processing, as described above, the thickness of the film may be reduced to the scale of the at least one SAM.

The photoactive region is deposited to form a donor-acceptor heterojunction. As discussed above, the present disclosure is not limited to any particular donor-acceptor heterojunction. In some embodiments, the photoactive region is deposited to form a donor-acceptor heterojunction chosen from a planar heterojunction, a mixed heterojunction, a bulk heterojunction, and a planar-mixed heterojunction.

The method of forming an organic photosensitive optoelectronic device may further comprise depositing a cathode buffer layer located between the photoactive region and the cathode. As described herein, the cathode buffer layer is chosen to block excitons and to facilitate electron transport to the cathode.

Further disclosed is method of treating a transition metal oxide substrate with a solution, comprising providing a substrate comprising a transition metal oxide, and applying a solution to at least one surface of the substrate, wherein the solution comprises a tetrahydrofuran (THF) solvent and molecules chosen from phosphonic acids, carboxylic acids, silanes and thiols.

In some embodiments, the transition metal oxide is chosen from transition metal oxides described herein. In some embodiments, the step of applying a solution comprises a technique chosen from spin coating, soaking, spray coating, blade coating, and slot dye coating.

In some embodiments, the phosphonic acids are chosen from those described herein.

The method may further comprise heating the substrate. Heating may occur during the application of the solution to the substrate and/or after applying the solution. In some embodiments, the substrate is heated at a temperature in a range from 40° C. to 200° C., from 80° C. to 160° C., from 100° C. to 140° C., from 110° C. to 130° C., or from 115° C. to 125° C.

The method may further comprise rinsing the at least one surface of the substrate with a solvent. In some embodiments, the solvent used for rinsing is THF.

There is also disclosed a method of treating a NiO substrate with a solution, comprising providing a substrate comprising NiO or an alloy thereof, and spin coating a solution onto at least one surface of the substrate, wherein the solution comprises a solvent and molecules chosen from phosphonic acids, carboxylic acids, silanes, and thiols.

In some embodiments, the phosphonic acids are chosen from phosphonic acids described herein. In some embodiments, the solvent is chosen from those described herein.

The method may further comprise heating the substrate. Heating may occur during and/or after the spin-coating. In some embodiments, the substrate is heated at a temperature in a range from 40° C. to 200° C., from 80° C. to 160° C., from 100° C. to 140° C., from 110° C. to 130° C., or from 115° C. to 125° C.

The method may further comprise rinsing the at least one surface of the substrate with a solvent. In some embodiments, the solvent in the solution and the solvent used for rinsing are the same. In some embodiments, the solvent in the solution and the solvent used for rinsing are both THF.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

The following examples demonstrate the exciton blocking effect of treating an anode buffer layer with a phosphonic acid. Benzylphosphonic acid (BPA), for example, includes phosphonic acid "head groups" which bond the phosphonic acid molecules to the surface of the anode buffer layer. It is believed that the organic benzyl "tail group" provides an exciton-blocking effect to the anode buffer layer, resulting in improved device performance. Although only phosphonic acids are shown in the Examples, other SAMs, such as carboxylic acids, silanes, and thiols described above, having "head groups" to anchor the molecules to the buffer layer surface and having organic "tail groups" will provide an exciton-blocking effect to the anode buffer layer. Thus, as described above, the present disclosure is not limited to only phosphonic acid SAMs.

Example 1

A sensitive method for determining the extent to which a material quenches or blocks excitons is to quantitatively compare the photoluminescence (PL) intensity from the optically pumped donor deposited on various surfaces to its intensity when deposited on perfectly quenching and blocking reference layers. Samples for PL quenching experiments were made with the structure: quartz/test layer (8 nm)/SubPc (40 nm)/BPhen (8 nm), where the test layer was an 8 nm thick layer of perfectly quenching $C_{60}$, perfectly blocking BPhen, $MoO_3$, NiO, or BPA treated $MoO_3$ or NiO. The organic layers and the $MoO_3$ were deposited by high vacuum (base pressure of ~$10^{-7}$ Torr) thermal evaporation (VTE). Depositing phosphonic acids on $MoO_3$ is substantially different than for ITO. When $MoO_3$ is soaked in a solution containing an alcohol (e.g., methanol and ethanol), the $MoO_3$ dissolves, precluding the most common deposition techniques of soaking and the tethering by aggregation and growth (TBAG) known in the art. By replacing the mixture of polar and alcohol solvents with THF (a solvent with similar properties to mixtures of chloroform and methanol), however, no loss in $MoO_3$ thickness was observed with variable angle spectroscopic ellipsometry (VASE). Thus, phosphonic acid self-assembled monolayers (SAMs) were formed by soaking the $MoO_3$-coated substrate for 30 minutes in a 1 mM solution of BPA dissolved in THF forming a 0.4-0.5 nm (~1 monolayer) thick BPA layer, as measured by VASE. The substrates were then heated in an ultrahigh-purity $N_2$ ambient at 120° C. for 30 minutes, resulting in a chemical bond between the BPA and $MoO_3$.

NiO buffer layers were deposited using e-beam evaporation at a rate of 0.5 Å/s and a deposition pressure of ~$2 \times 10^{-5}$ Torr and then transferred through the ambient to a Glen 1000P Asher where they were treated for 90 s with a remote oxygen plasma at 25 W and 150 mTorr.

When NiO was soaked in a 1 mM solution of various phosphonic acids in THF, the thickness of the NiO decreased with time, suggesting that phosphonic acids themselves are corrosive to the NiO. To deposit monolayers on NiO therefore, phosphonic acid solutions were spin coated onto the NiO surface. The buffer was then heated at 80 to 170° C. to form bonds between the acid and the NiO surface. The NiO surface was then rinsed with a solvent to remove any unreacted phosphonic acid. In particular, the NiO coated samples were transferred to an ultrahigh-purity $N_2$ filled glovebox where an ~5 to 6 nm thick layer of BPA was deposited via spin coating from a 1 g/l solution in THF. It was found that a 1 mg/ml solution of BPA in THF spun cast with a ramprate of 1000 revolutions per minute (rpm)/sec and a final speed of 3000 rpm resulted in a BPA thickness of about 6 nm. The samples were then heated for 30 minutes at 120° C. and then rinsed twice in pure THF, again leaving a 0.4-0.5 nm (~1 monolayer) thick residue of BPA as measured by VASE. The deposition of phosphonic acid SAMs was performed in a high purity nitrogen glovebox, but can also be performed in air.

X-ray photoemission spectra were obtained using a Thermo VG Scientific Clam 4MCD photoelectron emission analyzer and an Al-Kα source (1489 eV). Spectra were collected with a 20 eV constant pass energy, and showed phosphorous 2p ionization and an increase in the C 1 s response after the BPA treatment, indicating the presence of phosphonic acid on the NiO surface. Ultraviolet photoemission spectra (UPS) were obtained using a He—I emission lamp (21.218 eV) excitation, an accelerating voltage 9V, and a collector pass energy of 2.5 eV to determine the work functions, ionization energies, and vacuum level shifts between the NiO, BPA, and the organic materials.

Photoluminescence was measured by illuminating the films though the quartz substrate at 30° from normal with λ=400 to 650 nm wavelength light from a monochromated Xe arc lamp. The PL intensity (at λ=710 nm) was measured at 60° from normal, also through the substrate.

Figure 2A:
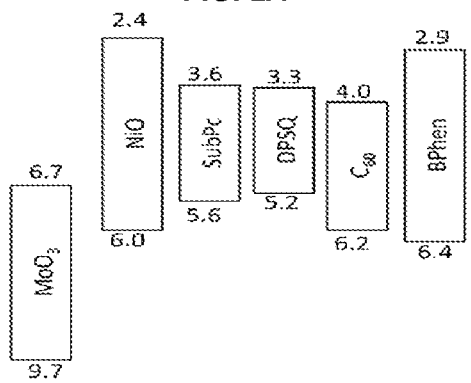
Figure 2B:
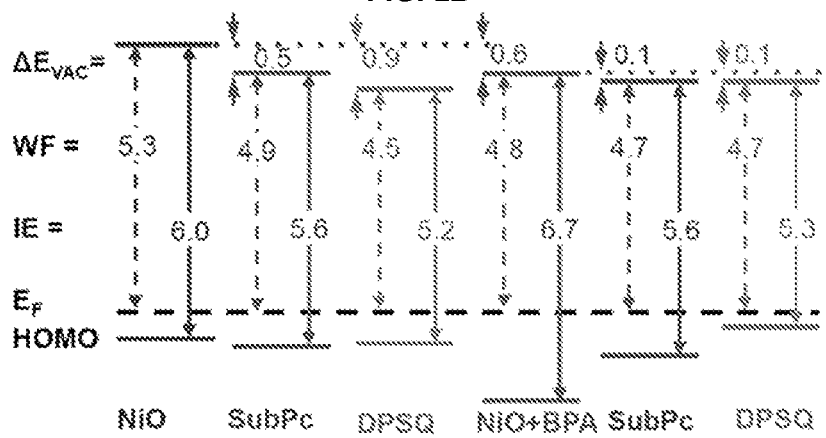

FIG. 2A shows valence and conduction band energies for $MoO_3$ and NiO, as well as HOMO an LUMO energies for SubPc, DPSQ, $C_{60}$ and BPhen, relative to vacuum, using literature values. Ionization (HOMO) energies for NiO, SubPc, and DPSQ were verified using UPS. A large interface dipole existed between $MoO_3$ and donor materials to allow for Fermi level alignment, resulting from significant charge transfer or molecular reorganization. Relevant HOMO ionization energies, work functions, and vacuum level offsets are shown in FIG. 2B, as measured by UPS. Organics deposited directly onto the NiO showed a 0.5 eV (for SubPc) and a 0.9 eV (for DPSQ) interface dipole energy shift suggesting the presence of significant molecular reorganization and/or charge transfer. Deposition of BPA on NiO was accompanied by a 0.6±0.1 eV shift in the vacuum level, and the subsequent dipole shift between the BPA-treated NiO and SubPc and DPSQ was negligible and within experimental error (±0.1 eV).

Figure 2C:
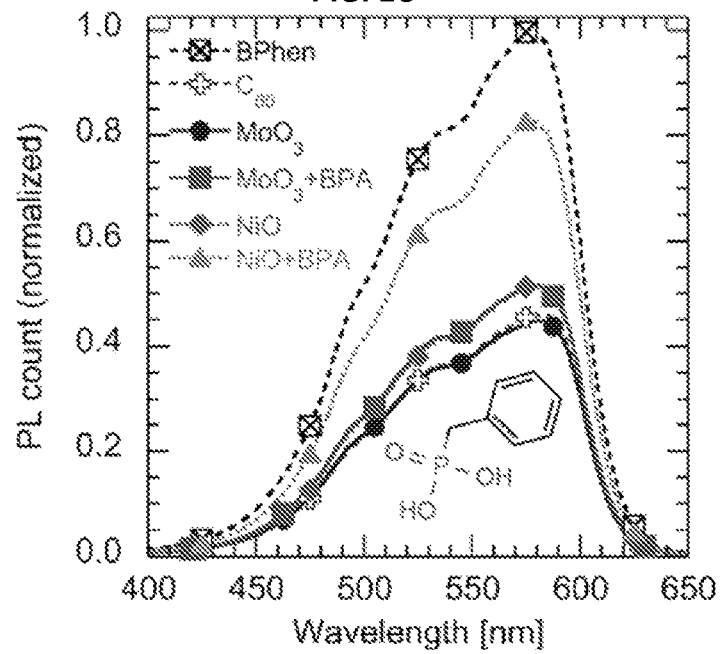

The PL quenching results are shown in FIG. 2C, providing a comparison of the blocking vs. quenching efficiencies of the various layers. The $MoO_3$ buffers had similar PL intensities to samples with $C_{60}$ buffers, indicating that excitons were efficiently quenched at the $MoO_3$/donor interface. The NiO buffer structures also had similar exciton quenching behavior (ranging from 85% to 100% quenching, depending on NiO deposition and plasma treatment process), despite the fact that the transport energy levels did not provide an obvious path to recombination or exciton dissociation with SubPc. The quenching likely occurred via recombination at surface states or defects within the band gap of the NiO. When BPA was applied to either the $MoO_3$ or NiO surfaces, the PL intensity increased, suggesting that approximately 15% and 70% of the excitons were blocked without quenching, respectively. The difference in blocking efficiency for buffers consisting of $MoO_3$ and NiO treated with SAMs of similar mean thickness likely resulted from different exciton quenching mechanisms. For BPA-treated $MoO_3$, the exciton dissociation remained relatively efficient (e.g., ~85% of excitons were quenched) and likely occurred when a hole in the donor HOMO tunneled to the conduction band of the $MoO_3$. In the case of BPA-treated NiO, however, only ~30% of the excitons reaching the interface were quenched.

Example 2

PL quenching results were also obtained for $MoO_3$ coated substrates having various thicknesses of phosphonic acid SAMs deposited via different techniques. The test structures were quartz/test layer (8 nm)/SubPc (40 nm)/BPhen (8 nm). The test layers were Co (~8 nm), BPhen (8 nm), $MoO_3$ (16 nm), and BPA treated $MoO_3$. For the BPA treated $MoO_3$, the $MoO_3$-coated substrate was soaked in a 1 mM solution of BPA in THF, resulting in approximately one monolayer of BPA (~0.5 nm thickness) attached to the surface of the $MoO_3$-coated substrate, as measured with VASE. In addition, layers of various phosphonic acids were spin coated from THF-typical concentrations ranged from 0.25 to 1 mg/ml in THF-resulting in an ~1-6 nm-thick film of phosphonic acid SAMs. A single solvent was chosen to prevent inhomogeneity in films caused by the incongruent evaporation of the solvent mixture. After heating at 120° C. for 30 minutes and rinsing in THF, the thickness remained the same as initially deposited (as measured by VASE). This suggested that the $MoO_3$ was diffusing into and reacting with the phosphonic acid SAMs.

Figure 3:
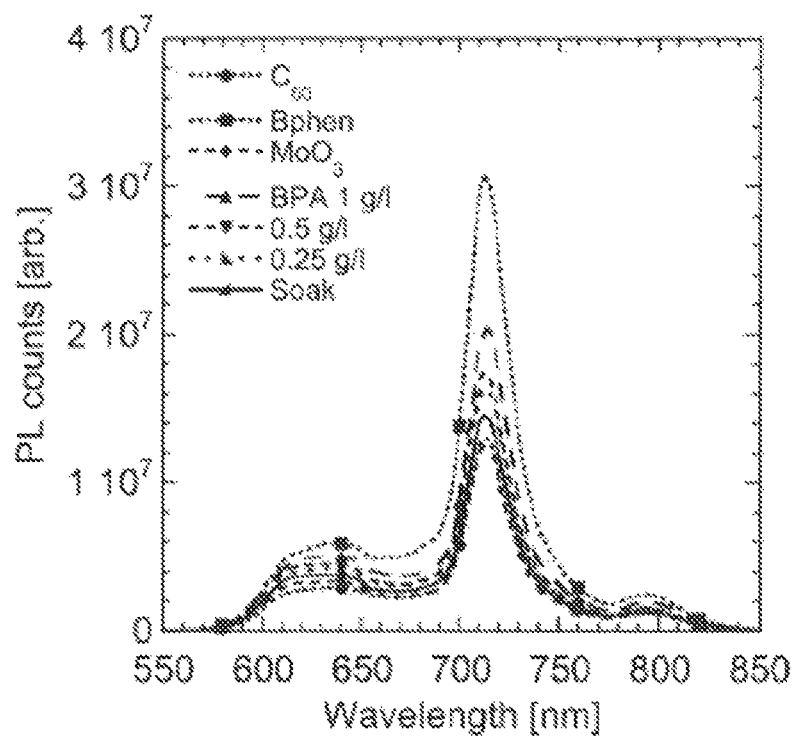
Figure 3:
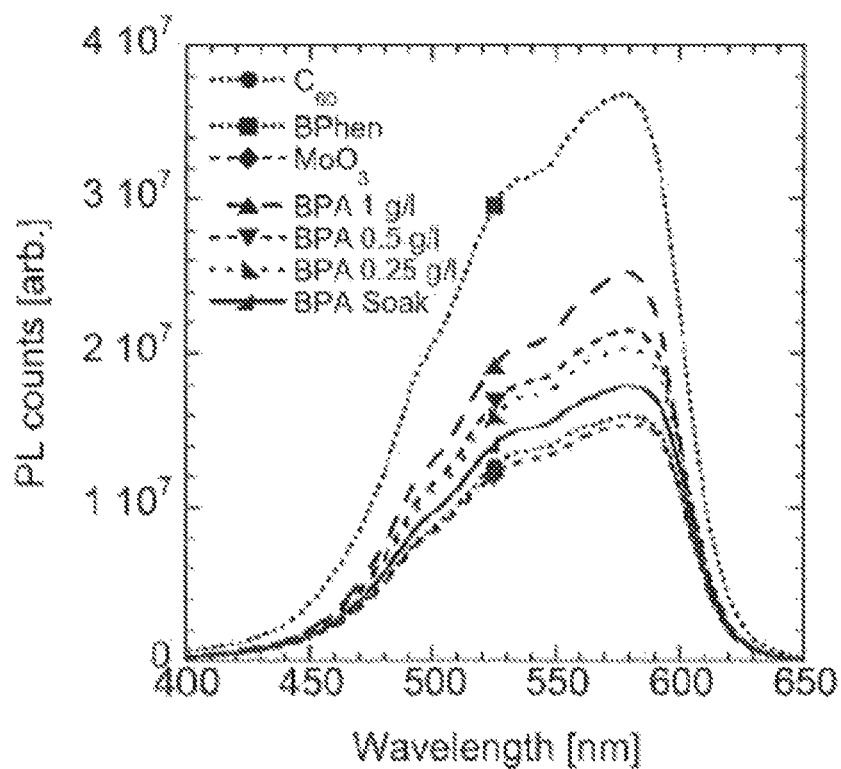
Figure 4:
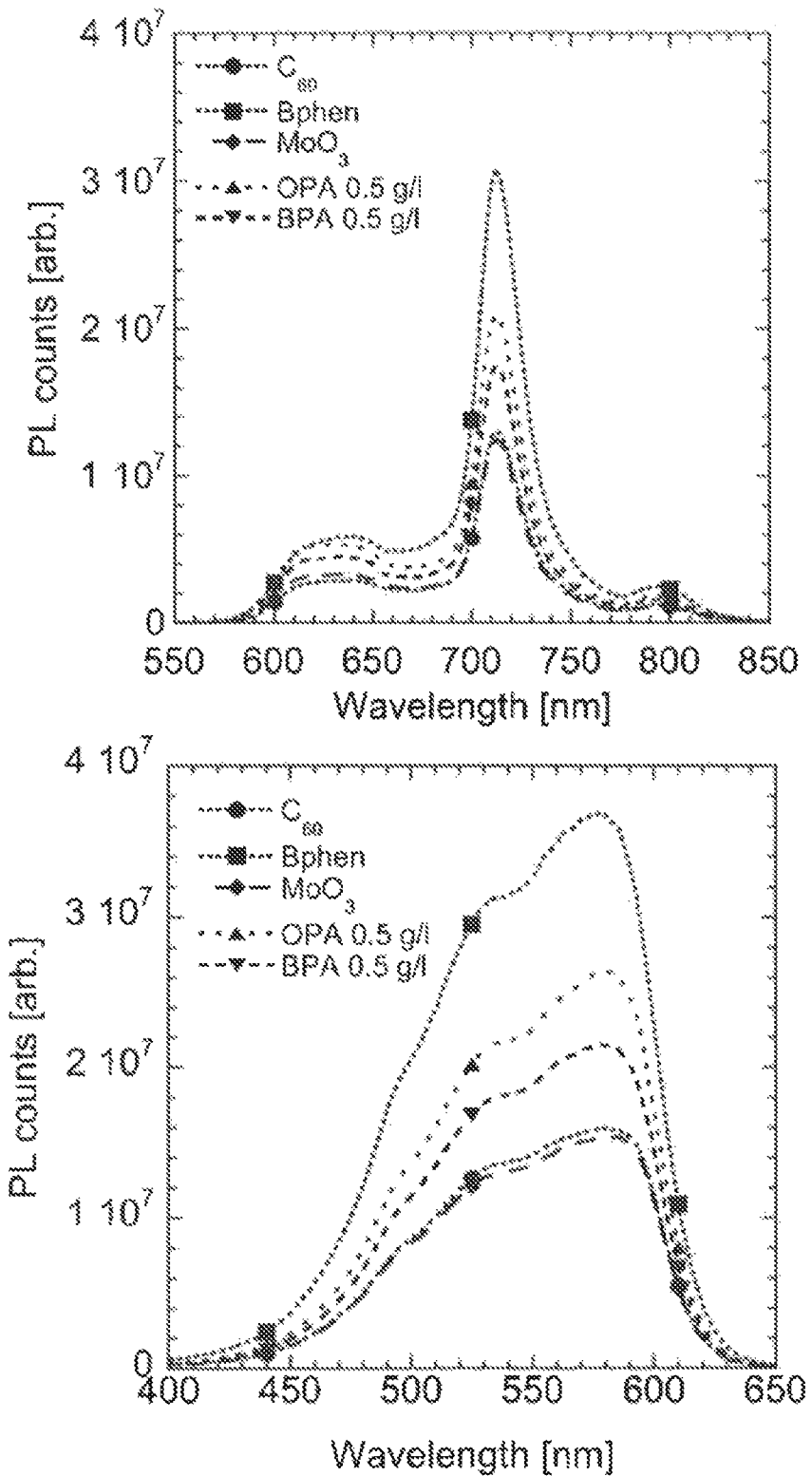

As shown in FIG. 3, the $MoO_3$ had similar PL to the reference quencher Coo, indicating strong quenching. By coating the $MoO_3$ surface with various thicknesses of BPA, as described above, improved blocking (50% for the 1 g/l sample) for thicker layers (e.g., spin coated from 1 g/l BPA in THF) was observed compared to the thinner layers (e.g., BPA soak or BPA spin coated from 0.25 g/l solutions). As shown in FIG. 4, an improved blocking efficiency was observed from octylphosphonic acid (OPA) compared to BPA, both applied at 0.5 g/l, even though the thickness of the OPA was thinner.

Figure 5:
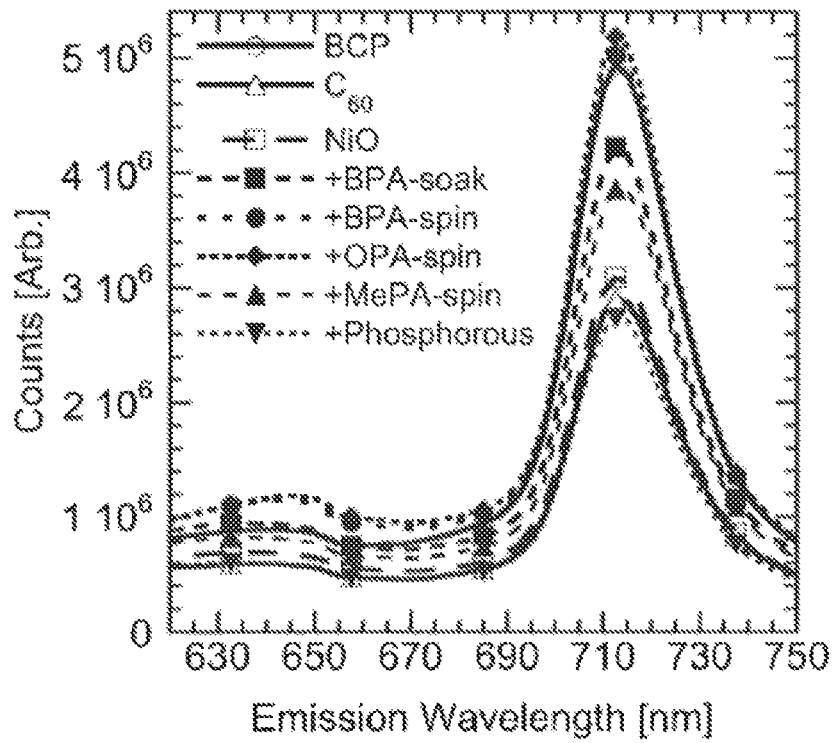
Figure 5:
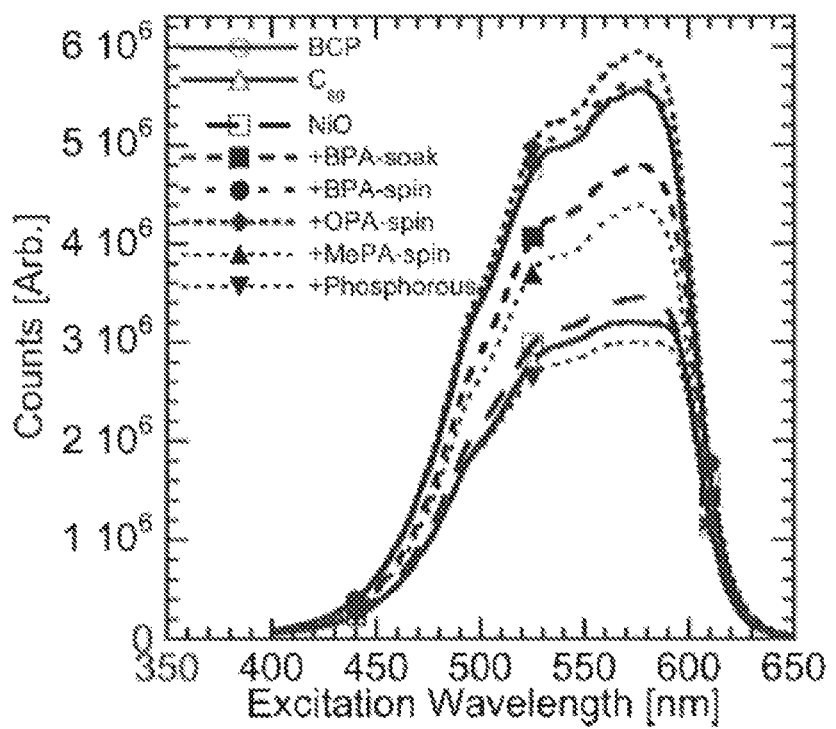

SAMs of various phosphonic acids at various concentrations were also deposited on NiO-coated substrates via spin coating, heating, and rinsing, as described above. A sample soaked in BPA was also generated. Results are shown in FIG. 5. As shown, PL for the OPA and BPA spin coated surfaces was similar to the blocking reference BCP, indicating near perfect blocking capabilities. SAMs of methylphosphonic acid (MePA) and phosphorous acid (Phosphorous) were also deposited similarly and the blocking efficiency of the MePA was found to be ~50% and the PL of the phosphorous acid was similar to the quenching reference. The NiO sample soaked in BPA showed a blocking efficiency mid-way between blocking and quenching.

Example 3

Bilayer OPVs were fabricated on detergent, solvent, and $CO_2$ snow-cleaned ITO substrates (Bayview Optics, sheet resistance: 20Ω/□) with the structure: glass/ITO/anode buffer/DPSQ (10 nm)/$C_{60}$ (40 nm)/cathode buffer/Ag (100 nm). Anode buffer layers were 20 nm and 8 nm thick for the $MoO_3$ and NiO, respectively. Cathode buffers were either PTCBI (5 nm) or BPhen:$C_{60}$ (1:1, 10 nm)/PTCBI (5 nm). The 10 nm-thick DPSQ donor was deposited by spin coating from a chloroform solution; all other organic layers were deposited via VTE and subsequently solvent-vapor-annealed in dichloromethane. Similar devices but with a 16 nm-thick 4:6 blend of asymmetric [2-[4-(N,N-diphenylamino)-2,6-dihydroxyphenyl]-4-[4-diphenyliminio] squaraine](DPASQ) and the symmetric DPSQ were also made. SubPc donor devices were also fabricated with structure glass/ITO/buffer/SubPc (10 nm)/$C_{60}$ (35 nm)/BPhen (8 nm)/Ag (100 nm). All thicknesses were calibrated using VASE in the transparent region of the material between wavelengths of λ=1000 and 1600 nm.

BPA SAMs were formed by soaking the $MoO_3$-coated substrate for 30 min in a 1 mM solution of BPA dissolved in THF, as described above, forming a 0.4-0.5 nm (~1 monolayer) thick BPA layer. The substrates were then heated in an ultrahigh-purity $N_2$ ambient at 120° C. for 30 min as described above. BPA SAMs were deposited on the NiO buffer layers via spin coating from a 1 g/l solution in THF in an ultrahigh-purity $N_2$ filled glovebox, as described above, resulting in an ~5 nm thick layer of BPA. The samples were then heated for 30 min at 120° C. and then rinsed twice in pure THF, leaving a 0.4-0.5 nm (~1 monolayer) thick residue of BPA.

$\eta_P$ was measured under 1 sun, AM 1.5G illumination and was corrected for spectral mismatch. Experimental errors in the $V_{OC}$ and FF for the samples were ±0.01V and ±1%, as determined by sample-to-sample variation, while errors in short circuit current density ($J_{SC}$) were dominated by uncertainty in measuring the spectrum and intensity of the solar simulator which, in-turn, dominated errors in $\eta_P$.

Figure 6:
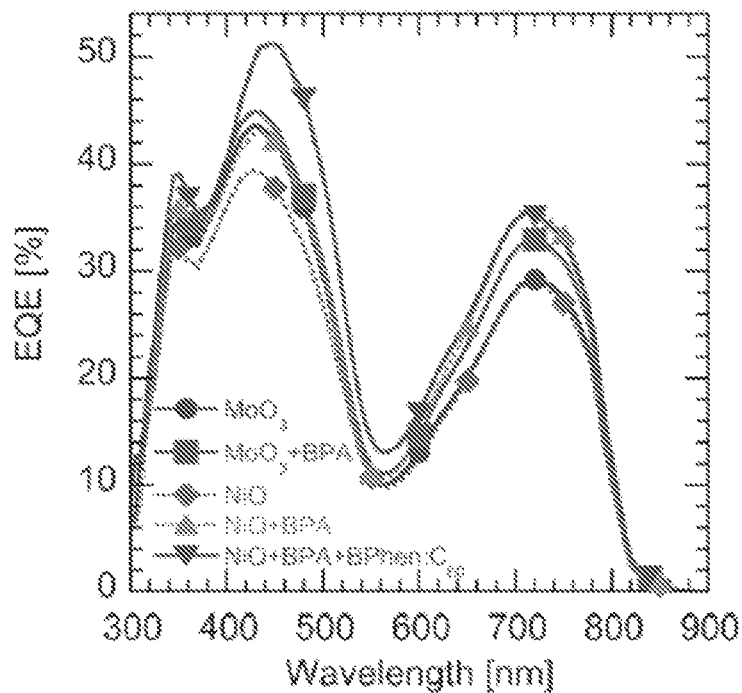
FIG. 6 shows EQE as a function of wavelength for DPSQ/$C_{60}$ based photovoltaic devices with various anode buffers. All devices had a PTCBI cathode buffer, except for the device labeled NiO+BPA+BPhen:$C_{60}$, which has a NiO+BPA anode buffer and a BPhen:$C_{60}$/PTCBI cathode buffer.

FIG. 6 shows the EQE for DPSQ/$C_{60}$ OPVs with the BPA-treated $MoO_3$ and NiO buffers. The reference device with a $MoO_3$ buffer and an untreated NiO buffer have EQE≈29% at λ=715 nm, while the BPA-treated $MoO_3$ and NiO have maximum EQE≈33% and 36%, respectively. The buffers with the highest PL yield and thus blocking efficiency, had the highest NIR EQE associated with absorption by the DPSQ donor. When the PTCBI cathode buffer layer was replaced with BPhen:$C_{60}$/PTCBI, the EQE at λ=400-600 nm was increased based on the reduced exciton-polaron quenching in the fullerene layer. Optical modeling of the structure employing a transfer matrix algorithm showed that the spectral shift in the response of the $C_{60}$ acceptor resulted from changes to the optical cavity incurred on inserting 10 nm of transparent BPhen:$C_{60}$ between the reflective cathode and the active layers. The model indicated no significant changes in the optical modes when inserting a monolayer of BPA between the NiO and the donor materials, which was anticipated given its extreme thinness.

Figure 7:
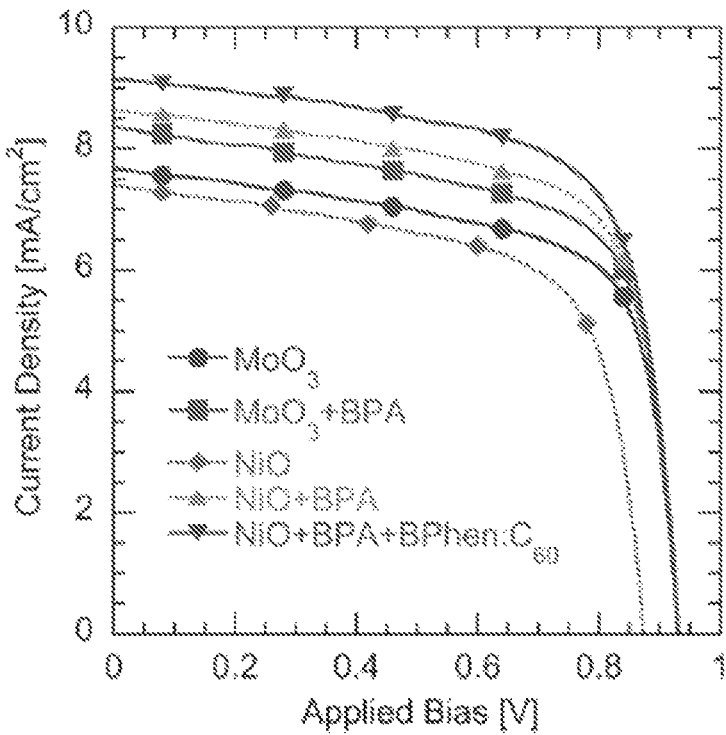
FIG. 7 shows current density vs. voltage characteristics for devices in FIG. 6 under 1 sun, AM 1.5G illumination, showing the increased photoresponse for the phosphonic acid treated buffers. The fill factor and open circuit voltage were not affected by the phosphonic acid treatment.

FIG. 7 shows the current density as a function of applied bias for the devices in FIG. 6. The NiO buffer had a reduced $J_{SC}$ and $V_{OC}$ compared to the other buffers tested, but the performance varied depending on deposition and plasma processing conditions. An increase in $J_{SC}$ and no changes in FF or $V_{OC}$ was observed for the BPA-treated $MoO_3$ and NiO buffers compared with the $MoO_3$ control device. As shown in Table I below, the device with the $MoO_3$ buffer had $\eta_P$=4.8±0.2%, the BPA-treated $MoO_3$ buffer layer had $\eta_P$=5.1±0.3%, and the BPA-treated NiO buffer had $\eta_P$=5.4±0.3%; a 13% increase compared to the untreated $MoO_3$ buffer. The efficiency was further increased to $\eta_P$=5.9±0.3% by incorporating the exciton blocking BPhen:$C_{60}$/PTCBI cathode buffer.

TABLE I

Photo voltaic performance for DPSQ/$C_{60}$ junctions with variuos buffer layers.

| Anode buffer | Cathode buffer | $J_{SC}$ [mA/cm$^2$] | $V_{OC}$ [V] | FF [%] | $\eta_P$ [%] |
|---|---|---|---|---|---|
| $MoO_3$ | PTCBI | 7.6 ± 0.4 | 0.93 | 68 | 4.8 ± 0.2 |
| $MoO_3$ + BPA | PTCBI | 8.2 ± 0.4 | 0.93 | 68 | 5.1 ± 0.3 |
| NiO | PTCBI | 7.2 ± 0.4 | 0.87 | 66 | 4.1 ± 0.2 |
| NiO + BPA | PTCBI | 8.5 ± 0.4 | 0.93 | 68 | 5.4 ± 0.3 |
| NiO + BPA | BPhen:$C_{60}$ | 9.1 ± 0.5 | 0.93 | 69 | 5.9 ± 0.3 |

Figure 8:
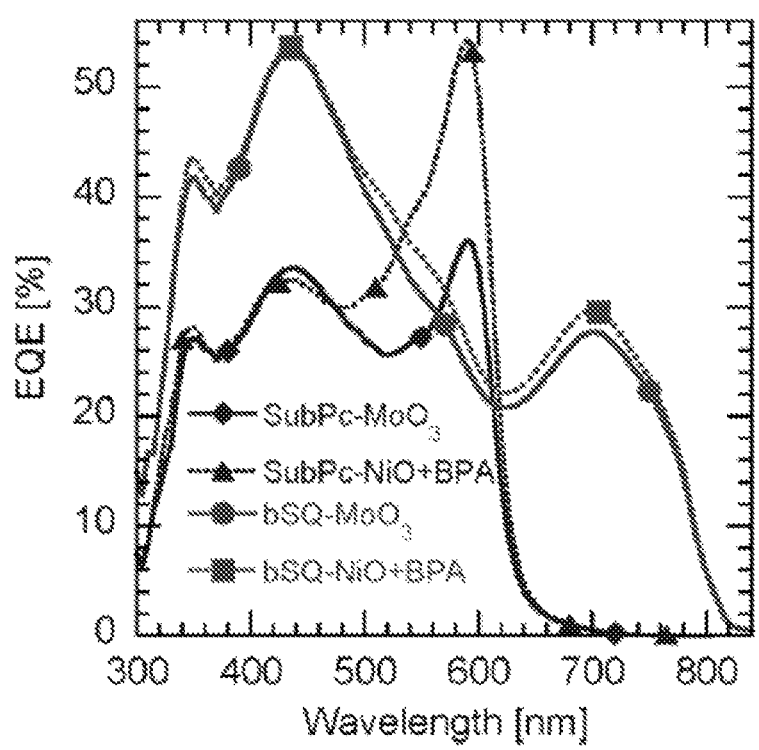
FIG. 8 shows EQE as a function of wavelength for SubPc/Co/BPhen and blended squaraine (bSQ)/$C_{60}$/PTCBI cells fabricated on $MoO_3$ and BPA-treated NiO buffers.

To demonstrate the general applicability of the phosphonic acid buffer treatments, BPA-treated NiO was compared to $MoO_3$ buffers for both SubPc/$C_{60}$ and bSQ/$C_{60}$ devices in FIG. 8 and Table II below. The SubPc/$C_{60}$ device showed an ~50% improvement in the SubPc response at λ=590 nm, which resulted in an increase in efficiency from $\eta_P$=3.1±0.2% to $\eta_P$=3.8±0.2%. The bSQ device showed a smaller improvement in EQE of ~6% due to interdiffusion of the donor and acceptor materials during solvent vapor annealing, resulting in a bulk heterojunction-like morphology conducive to more efficient exciton dissociation. Nonetheless, the efficiency improved from $\eta_P=5.5\pm0.3\%$ to $\eta_P=6.0\pm0.3\%$ (Table II).

TABLE II

Photovoltaic performance for SubPc/C$_{60}$/BPhen and bSQ/C$_{60}$/PTCBI junctions with MoO$_3$ and BPA treated NiO buffer layers.

| Anode buffer | Donor material | $J_{SC}$ [mA/cm$^2$] | $V_{OC}$ [V] | FF [%] | $\eta_P$ [%] |
|---|---|---|---|---|---|
| MoO$_3$ | SubPc | 4.7 ± 0.2 | 1.10 | 60 | 3.1 ± 0.2 |
| NiO + BPA | SubPc | 6.0 ± 0.3 | 1.10 | 56 | 3.8 ± 0.2 |
| MoO$_3$ | bSQ | 8.7 ± 0.4 | 0.87 | 70 | 5.5 ± 0.3 |
| NiO ± BPA | bSQ | 9.2 ± 0.5 | 0.93 | 70 | 6.0 ± 0.3 |

Example 4

Figure 9:
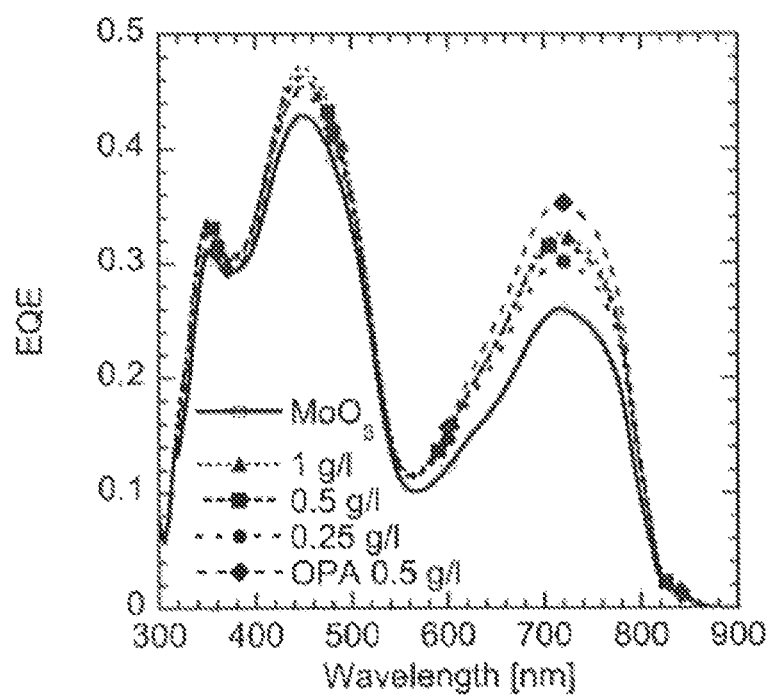
FIG. 9 shows EQE (top) and current-voltage performance (bottom) for devices with the structure: glass/ITO/buffer/ DPSQ (9 nm)/$C_{60}$ (40 nm)/PTCBI (5 nm)/Ag (100 nm). $MoO_3$ represents the reference untreated device and "1 g/l," "0.5 g/l," and "0.25 g/l" indicate the concentration of BPA spin coated onto $MoO_3$. OPA at 0.5 g/l also was spin coated onto $MoO_3$ for one device.
Figure 9:
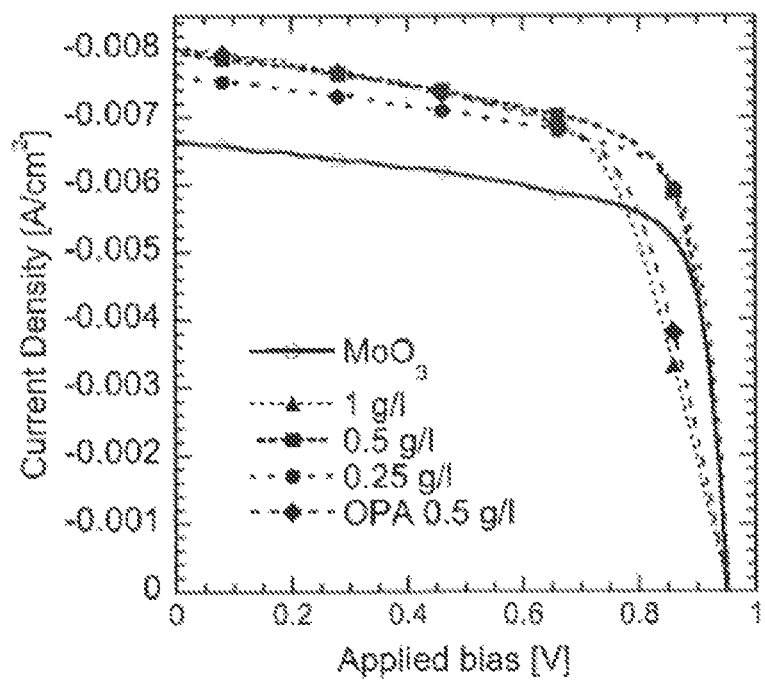

FIG. 9 shows the effect of blocking efficiency on BPA and OPA treated MoO$_3$ surfaces where the BPA or OPA was spin coated onto the MoO$_3$ and heat treated to bond the acid to surface. The photocurrent and near infrared (NIR) EQE response from the donor increased for all treatments, saturating for concentrations above 0.25 g/l BPA. An increase in series resistance (and decrease in FF), however, was observed for the devices treated with 0.5 g/l OPA and 1 g/l BPA which reduced the overall efficiency.

Example 5

FIG. 10 shows device performance data for DPSQ/C$_{60}$ devices with a BPA-treated MoO$_3$ anode buffer that was soaked for 30 minutes in BPA dissolved in THF or that was spin coated from either a chloroform methanol solution (CM) or THF. The NIR and total photo response and consequently FF were highest for the MoO$_3$ soaked in the BPA solution. The soaking method also allowed for a single monolayer of phosphonic acid to be deposited on MoO$_3$.

Example 6

FIG. 11 shows the effects of treating the MoO$_3$ anode buffer with different soak durations in BPA or OPA dissolved in THF. The longer soak time resulted in slightly higher photocurrent and power conversion efficiency ($\eta_P$) for BPA treatments. The OPA treatment resulted in slightly reduced FF and $J_{sc}$.

Example 7

FIG. 12 shows the effects of various donor layer thicknesses in DPSQ/C$_{60}$ junctions. The NIR quantum efficiency was maximized for a DPSQ thickness of ~13 nm on the MoO$_3$ anode buffer surface, while the NIR quantum efficiency was highest at 8 nm DPSQ thickness on the BPA-treated MoO$_3$ surface. The device yield, however, for DPSQ thicknesses of <10 nm was significantly reduced.

Example 8

FIG. 13 compares the quantum efficiency of MoO$_3$ and BPA-treated MoO$_3$ (30 min soak) anode buffers to NiO and BPA-, OPA-, MePA-, and phosphorous acid-treated NiO (applied by spin coating, heating and rinsing as described above). The DPSQ donor has a response from $\lambda$=550 nm to 800 nm. The NIR EQE was highest for the OPA-treated surface and all phosphonic acid treatments show Improved EQE. The EQE corresponded to the exciton blocking efficiency in FIGS. 3-5. An approximate 30% increase in EQE was observed for the best blocking interfaces. FIG. 14 shows that the highest $\eta_P$ was observed for the BPA-treated NiO and that the OPA treatment, while having a high $J_{sc}$, had a reduced FF due to an increase in series resistance. In particular, an infection in the current starting at 10$^{-3}$ Acm$^{-2}$ for the OPA treated NiO sample and at 2×10$^{-2}$ Acm$^{-2}$ for the MePA treated NiO was observed. This extra resistance to current extraction was seen in the illuminated curves. The power conversion efficiencies for the samples with the various buffer layers were as follows: the MoO$_3$ reference was 4.8%, the BPA soaked MoO$_3$ was 5.2%, the BPA treated NiO was 5.6%, the OPA treated NiO was 5.5%, the MePA treated NiO 5.5%, and the phosphorous acid treated NiO was 4.0%.

Example 9

FIG. 15 shows the effect of varying the temperature at which the BPA was bonded to the NiO. At 80° C., a NIR EQE of about 32% was observed, but at a bonding temperature of 170° C. the NIR EQE increased to about 38%. As the temperature was increased, and specifically when the temperature increased above ~120° C., however, the current-voltage curves degraded and, specifically, an S-kink emerged indicating a loss in FF. S-kinks are generally attributed to a reverse diode in the system, which likely occurred from a decrease in the work function originating from a change in the dipole associated with the phosphonic acid, resulting in a decrease in the effective work function and effective frontier orbital energy levels of the NiO. The ideal heating temperature for bonding the phosphonic acids to the anode buffer surfaces for the tested samples was around 120° C.

Example 10

FIG. 16 shows the effect of using modified BPA acid groups with different dipole moments, e.g. comparing unmodified BPA, BPA fluorinated in the 4-position of the benzyl ring, and BPA fluorinated in all 5 positions of the benzyl ring as depicted in FIG. 16. The EQE from DPSQ/C$_{60}$ devices is shown in FIG. 16 where the highest NIR EQE (and thus blocking efficiency) was achieved by the unmodified BPA treatment. The fluorinated compounds had a reduced EQE at $\lambda$=700 nm (from the DPSQ donor) compared to the unmodified BPA sample.

FIG. 17 shows the current-voltage response under illumination and in the dark for the devices in FIG. 16. The unmodified BPA-treated sample exhibited a small inflection in dark current (indicating small reverse diode), while the J-V curves for the fluorinated BPAs did not, but the $J_{SC}$ was reduced for the fluorinated BPAs. FIG. 17 shows that the work function of the BPA treated NiO was too shallow and that choosing a phosphonic acid with a dipole moment, such as fluorinated BPAs to induce a dipole, can act to lower the work function of the NiO and improve the extraction efficiency of the contact.

Example 11

FIG. 18 compares EQE and J-V performance data for devices with different lengths of aryl terminated phosphonic acids. All of the variants reduced exciton quenching, but the best results were observed for the BPA-treated NiO surface.

The series resistance increased for napthylmethylphosphonic acid and propylphenylphosphonic acid, the longer acids tested.

Example 12

FIG. 19 compares EQE and J-V performance data for devices with various alkyl chain lengths from zero carbons (phosphorous acid) to a 16-carbon, hexadecyl phosphonic acid on an NiO surface. These alkylphosphonic acid SAMs all led to improved EQE. The highest EQE occurred for the longest chains, but these chains showed significantly reduced fill factor and power conversion efficiency compared to the shorter chains. The best power conversion efficiency was observed for butylphosphonic acid, where shorter chains resulted in less exciton quenching and low resistance and the longer chains had a higher NIR EQE but an increased resistance or an S-kink in the J-V curve.

What is claimed is:

1. An organic photosensitive optoelectronic device comprising:
an anode and a cathode in superposed relation;
a photoactive region comprising at least one organic donor material and at least one organic acceptor material disposed between the anode and the cathode forming a donor-acceptor heterojunction;
an anode buffer layer disposed between the anode and the photoactive region, wherein the anode buffer layer has a bottom surface closer to the anode and a top surface further from the anode; and
at least one self-assembled monolayer disposed on the top surface of the anode buffer layer between the anode buffer layer and the photoactive region,
wherein the at least one self-assembled monolayer comprises a layer of molecules having head groups that bond with the top surface of the anode buffer layer and tail groups comprising carbon-based structures, and
wherein at least one head group comprises at least one phosphonic acid.

2. The device of claim 1, wherein the anode buffer layer comprises a transition metal oxide.

3. The device of claim 2, wherein the transition metal oxide is chosen from $MoO_3$, $V_2O_3$, $ReO_3$, $WO_3$, $TiO_2$, $Ta_2O_3$, $ZnO$, $NiO$, and alloys thereof.

4. The device of claim 3, wherein the transition metal oxide is chosen from $MoO_3$, $NiO$, and alloys thereof.

5. The device of claim 3, wherein the at least one self-assembled monolayer comprises benzylphosphonic acid or a functionalized derivative thereof.

6. The device of claim 1, wherein the at least one phosphonic acid is chosen from alkylphosphonic acids, arylphosphonic acids, and functionalized derivatives thereof.

7. The device of claim 6, wherein the arylphosphonic acids are chosen from phenylphosphonic acid, benzylphosphonic acid, propylphenyl phosphonic acid, naphthylmethylphosphonic acid, and functionalized derivatives thereof.

8. The device of claim 6, wherein the alkylphosphonic acids are chosen from

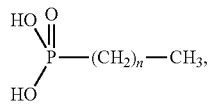

wherein n is chosen from 0 to 15.

9. The device of claim 8, wherein the alkylphosphonic acids are chosen from methylphosphonic acid, ethylphosphonic acid, propylphosphonic acid, butylphosphonic acid, and functionalized derivatives thereof.

10. The device of claim 1, wherein the at least one self-assembled monolayer comprises benzylphosphonic acid, butylphosphonic acid, or a functionalized derivative thereof.

11. The device of claim 1, wherein the at least one self-assembled monolayer has a thickness in a range from about 0.4 nm to 1 nm.

12. The device of claim 1, wherein the anode buffer layer in the device exhibits less exciton quenching behavior compared to the anode buffer layer in the device without the at least one self-assembled monolayer.

13. The device of claim 1, wherein the donor-acceptor heterojunction is chosen from a planar heterojunction, a mixed heterojunction, a bulk heterojunction and a planar-mixed heterojunction.

14. The device of claim 1, further comprising a cathode buffer layer disposed between the photoactive region and the cathode.

15. A method of forming an organic photosensitive optoelectronic device comprising:
depositing an anode buffer layer over an anode, wherein the anode buffer layer has a bottom surface closer to the anode and a top surface further from the anode;
depositing at least one self-assembled monolayer on the top surface of the anode buffer layer, wherein the at least one self-assembled monolayer comprises a layer of molecules having head groups that bond with the top surface of the anode buffer layer and tail groups comprising carbon-based structures, and
wherein at least one head group comprises at least one phosphonic acid;
depositing a photoactive region over the anode buffer layer, wherein the photoactive region comprises at least one organic donor material and at least one organic acceptor material forming a donor-acceptor heterojunction; and
depositing a cathode over the photoactive region;
wherein the at least one self-assembled monolayer is disposed between the anode buffer layer and the photoactive region.

16. The method of claim 15, wherein the at least one self-assembled monolayer is deposited by physical vapor deposition.

17. The method of claim 15, wherein the step of depositing at least one self-assembled monolayer comprises applying a solution to at least the top surface of the anode buffer layer.

18. The method of claim 17, wherein the solution comprises a solvent and the at least one phosphonic acid.

19. The method of claim 18, wherein the solvent comprises an alcohol or tetrahydrofuran (THF).

20. The method of claim 18, wherein the solution is applied using a technique chosen from spin coating, soaking, spray coating, blade coating, and slot dye coating.

21. The method of claim 18, wherein the anode buffer layer comprises a transition metal oxide.

22. The method of claim 17, wherein the step of depositing at least one self-assembled monolayer further comprises heating the anode buffer layer.

23. The method of claim 22, wherein the anode buffer layer is heated at a temperature in a range from 40° C. to 200° C.

24. The method of claim 22, wherein the step of depositing at least one self-assembled monolayer further comprises rinsing at least the top surface of the anode buffer layer with a solvent.

25. The method of claim 24, wherein the anode buffer layer comprises NiO or an alloy thereof.

26. The method of claim 15, wherein the step of depositing at least one self-assembled monolayer comprises applying a phosphonic acid solution to at least the top surface of the anode buffer layer, wherein the phosphonic acid solution is applied using a technique chosen from spin coating, soaking, spray coating, blade coating, and slot dye coating.

27. The method of claim 15, wherein the anode buffer layer comprises a transition metal oxide.

28. The method of claim 27, wherein the transition metal oxide is chosen from $MoO_3$, $V_2O_3$, $ReO_3$, $WO_3$ $TiO_2$, $Ta_2O_3$, $ZnO$, $NiO$, and alloys thereof.

29. The method of claim 15, wherein the phosphonic acid is chosen from benzylphosphonic acid or a functionalized derivative thereof and butylphosphonic acid or a functionalized derivative thereof.

30. The method of claim 15, wherein the at least one self-assembled monolayer has a thickness in a range from 0.4 nm to 1 nm.

31. The method of claim 15, further comprising depositing a cathode buffer layer between the photoactive region and the cathode.

* * * * *